(12) United States Patent
Yasuda

(10) Patent No.: US 7,009,269 B2
(45) Date of Patent: Mar. 7, 2006

(54) SEMICONDUCTOR DEVICE

(75) Inventor: Yukio Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 62 days.

(21) Appl. No.: 10/853,230

(22) Filed: May 26, 2004

(65) Prior Publication Data

US 2005/0104153 A1    May 19, 2005

(30) Foreign Application Priority Data

Nov. 14, 2003    (JP)    ............................. 2003-384550

(51) Int. Cl.
*H01L 27/095* (2006.01)
(52) U.S. Cl. ..................................... 257/477; 257/577
(58) Field of Classification Search .................... None
See application file for complete search history.

(56) References Cited

U.S. PATENT DOCUMENTS 6,441,463 B1    8/2002    Yasuda ...................... 257/577

2004/0027753 A1 *    2/2004    Friedrichs et al. ............ 361/90

FOREIGN PATENT DOCUMENTS

| JP | 6-244413 | 9/1994 |
|----|----------|--------|
| JP | 2002-16254 | 1/2002 |

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

In the semiconductor device including a control input terminal, a GND terminal and an output terminal, and also having an IGBT and a control circuit driving the IGBT, a ground resistance and a temperature compensation resistance are connected in series to each other between the control input terminal and the GND terminal. A polysilicon resistance provided on an insulating film formed in a semiconductor substrate in which the IGBT is provided is employed as the ground resistance. A diffusion resistance obtained by injecting an impurity into said semiconductor substrate and performing a diffusion operation is employed as the temperature compensation resistance.

17 Claims, 18 Drawing Sheets

F I G . 8
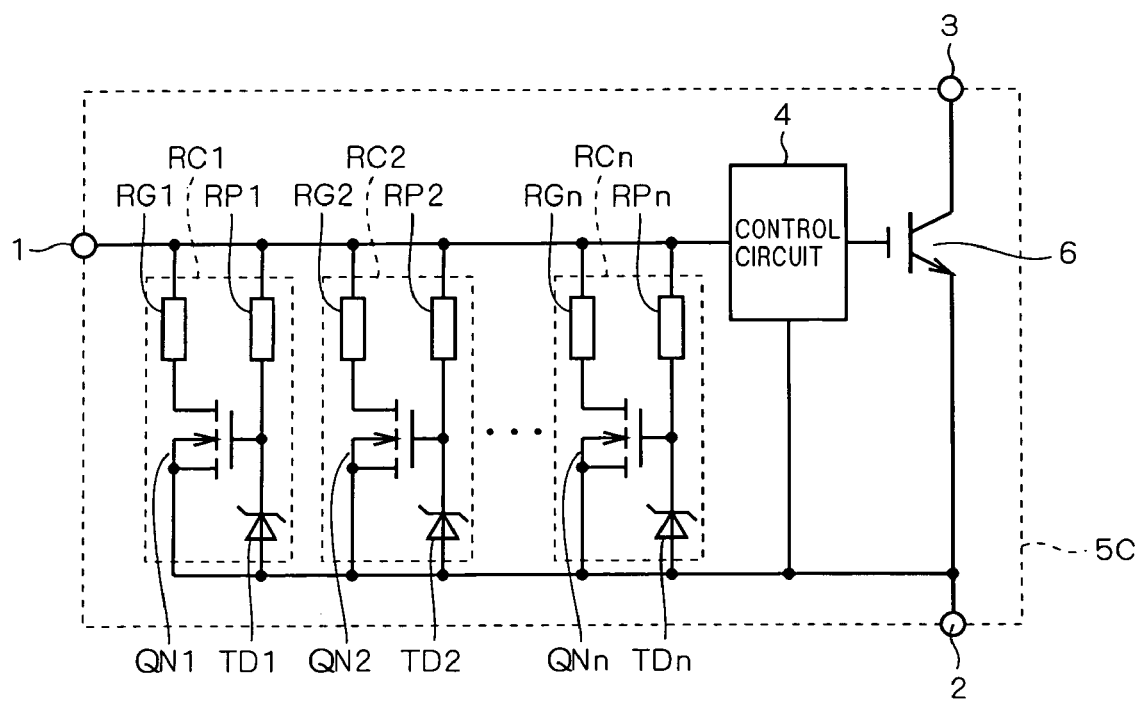

F I G . 9
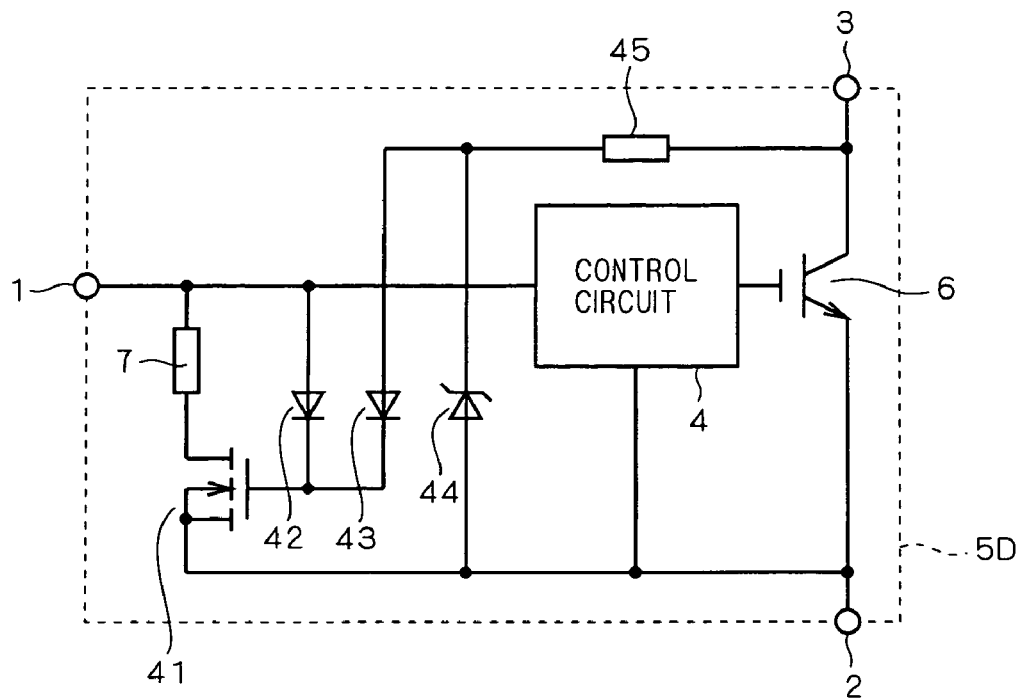
F I G . 1 0
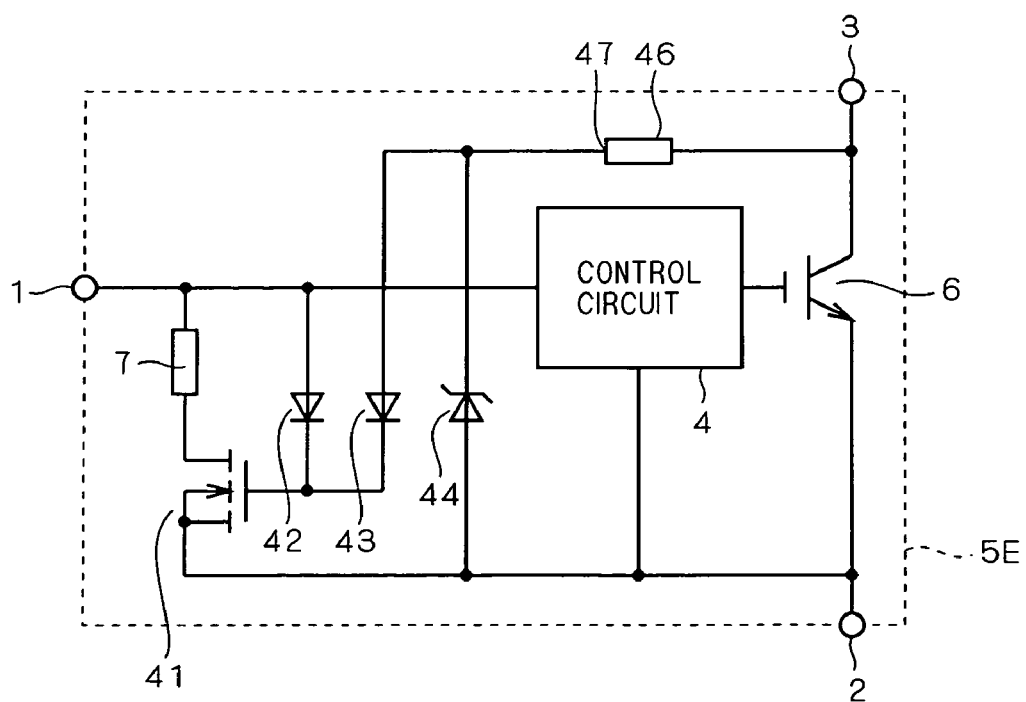

F I G . 1 6
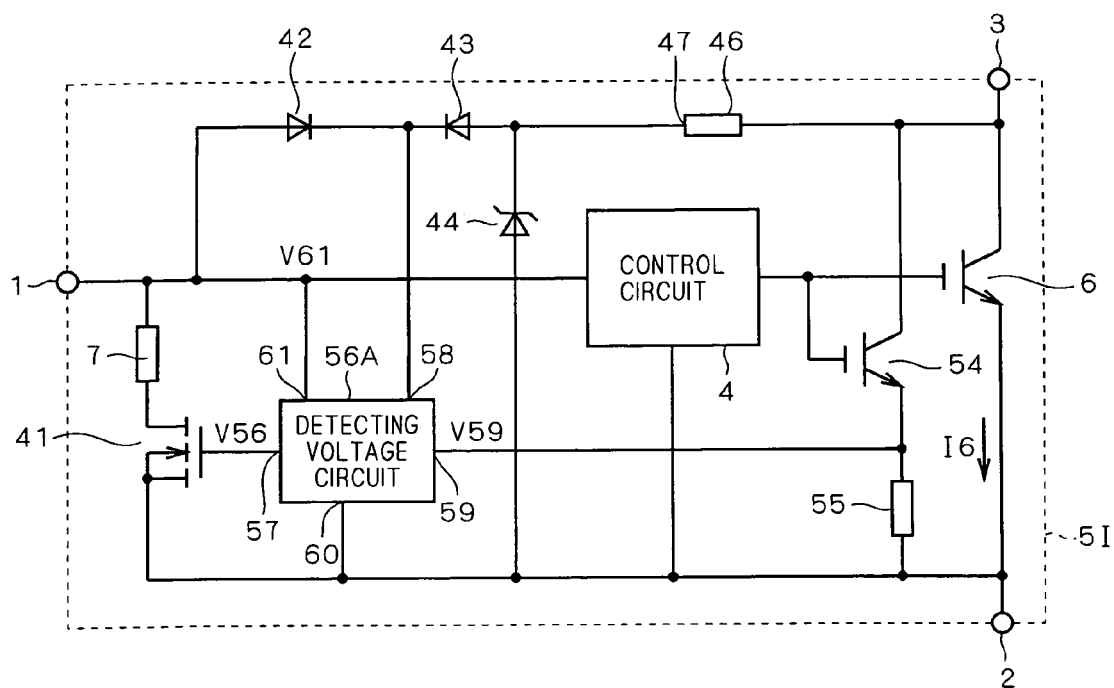

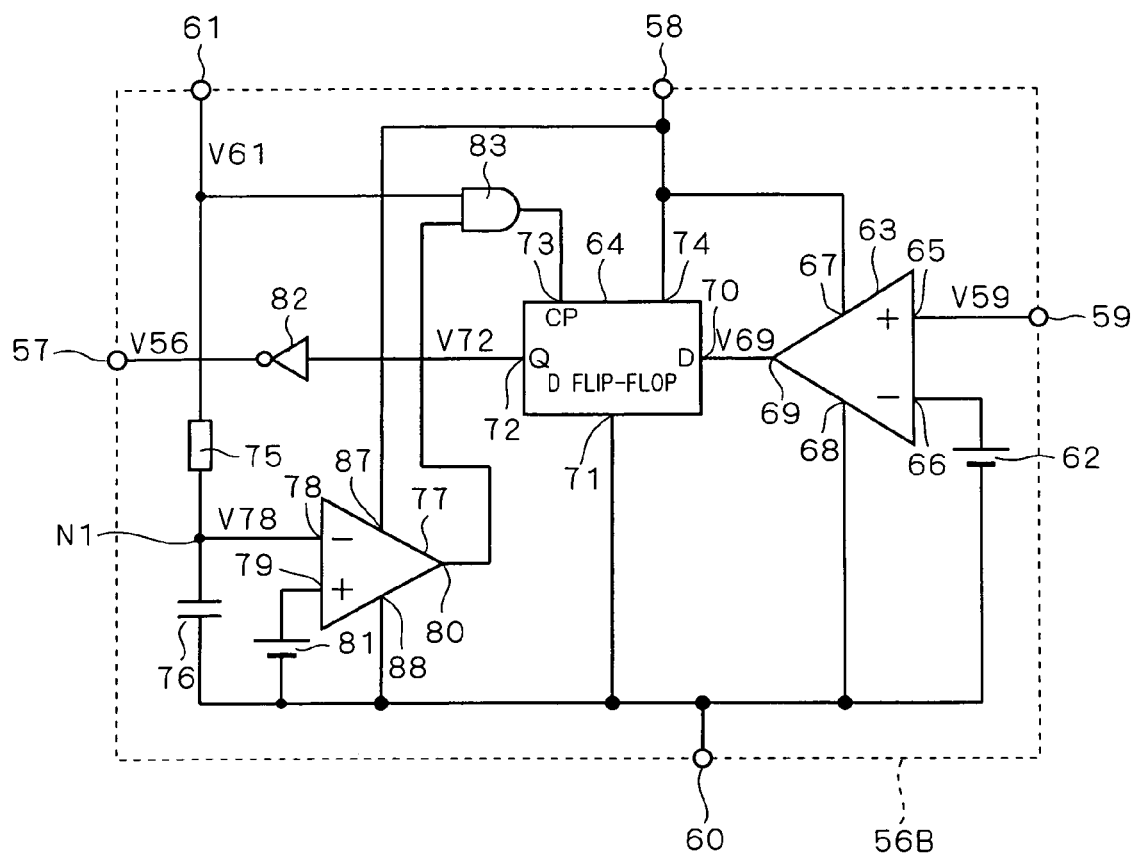
F I G . 1 9

SEMICONDUCTOR DEVICE

BACKGROUND OF THE INVENTION

1. Field of the Invention

The present invention relates to a semiconductor device including power switching elements such as an Insulated Gate Bipolar Transistor (IGBT) and so on and its control circuits.

2. Description of the Background Art

Generally, when a control region such as a circuit element, a well to form a circuit element or the like are formed on a semiconductor substrate in which an IGBT which is a power switching element is formed, a parasitic element is generated. In particular, in case that the circuit element is formed on the IGBT by employing a junction separating technique, it is known that a parasitic thyristor is formed by a substrate forming the IGBT and the circuit region, and when this parasitic thyristor is turned on and a latch-up phenomenon occurs, a problem such as leading up to a breakage of the semiconductor device including the IGBT itself and so on occurs.

It is necessary to take measures to place a protective element and so on to prevent such a latch-up phenomenon of the parasitic thyristor, and there is a semiconductor device disclosed in Japanese Patent Application Laid-Open No. 2002-16245, for example, as to take such measures. Means to prevent the latch-up of the parasitic thyristor by employing a schottky barrier diode is disclosed in this semiconductor device.

In the meantime, there is a case that a circuit to measure a voltage generated when a current minute enough to keep the semiconductor device from performing a driving operation is poured from an input terminal of the semiconductor device and to determine that the input terminal is disconnected in case that this voltage reach a predetermined value is added to detect a condition that the input terminal side of the semiconductor device is disconnected in a circuit side driving the semiconductor device including the IGBT composed as described above from outside. Besides, the driving operation of the semiconductor device means an operation of the semiconductor device controlling a conduction/non-conduction between an output terminal and a reference terminal on the basis of a voltage obtained from the input terminal. That is to say, it means that the output terminal and the reference terminal are disconnected with each other (in OFF state) in case that a difference voltage generated between the reference terminal and the input terminal is smaller than a predetermined value, and the output terminal and the reference terminal are connected with each other (in ON state) in case that the difference voltage described above is larger than the predetermined value.

A means such as pulling up by a resistance having a large resistance value (several tens of k$\Omega$, for example) is employed as a means of generating the minute current described above. The voltage obtained by pouring the minute current from the input terminal of the semiconductor device is greatly influenced by an input impedance of the semiconductor device, thus an improvement in an accuracy of the input impedance is required.

A means of providing a resistance in parallel with a control circuit formed in the semiconductor device and so on between the input terminal and the reference terminal (ground terminal) in the semiconductor device is considered as a means of improving the accuracy of the input impedance, for example. At this moment, in case that a resistance such as a polysilicon resistance and so on which can be formed on the semiconductor substrate is employed to control a generation of the parasitic element effectively, it is difficult to form the resistance with higher accuracy because of a change depending on an ambient temperature and an influence of a manufacturing variation and so on.

In this manner, there is a problem in the semiconductor device including the conventional power switching element that the improvement in the accuracy of the input impedance cannot be performed effectively.

SUMMARY OF THE INVENTION

It is an object of the present invention to obtain a semiconductor device including a switching element and its control circuit with controlling a generation of a parasitic element to the utmost and performing an improvement in an accuracy of an input impedance.

A semiconductor device according to the present invention includes an input terminal, a reference terminal, an output terminal, a switching element, a control circuit and a resistance part.

The switching element is formed on a semiconductor substrate, one electrode is connected with the output terminal and other electrode is connected with the reference terminal. The control circuit provides a control signal for a control electrode of the switching element based on an input voltage obtained by the input terminal to control a conduction/non-conduction of the switching element. The resistance part is formed on the semiconductor substrate and interposed between the input terminal and the reference terminal an input impedance of the input terminal, an input impedance of the input terminal is defined by the resistance part.

The resistance part includes a first and a second resistances and the first resistance has a first temperature dependence. The second resistance is connected in parallel with or in series to the first resistance and has a second temperature dependence. The input impedance is defined by a combined resistance by the first and the second resistances. The first and the second temperature dependences are in an opposite relation to each other in a change of a resistance value according to a temperature change.

The first temperature dependence of the first resistance and the second temperature dependence of the second resistance are in an opposite relation to each other, thus the combined resistance by the first and the second resistances has the temperature dependence countering the first and the second temperature dependences. As a result, the input impedance with small temperature dependence and high accuracy can be obtained as the combined resistance described above.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a circuit diagram illustrating a composition of a semiconductor device in which an IGBT is built according to a preferred embodiment 3 of the present invention.

FIG. 9 is a circuit diagram illustrating a composition of a semiconductor device in which an IGBT is built according to a preferred embodiment 4 of the present invention.

FIG. 10 is a circuit diagram illustrating a composition of a semiconductor device in which an IGBT is built according to a preferred embodiment 5 of the present invention.

FIG. 16 is a circuit diagram illustrating a composition of a semiconductor device in which an IGBT is built according to a preferred embodiment 9 of the present invention.

FIG. 19 is a circuit diagram illustrating an internal composition of a voltage detecting circuit employed in a semiconductor device according to a preferred embodiment 10 of the present invention.

DESCRIPTION OF THE PREFERRED EMBODIMENTS

<Preferred Embodiment 1>

Figure 1:
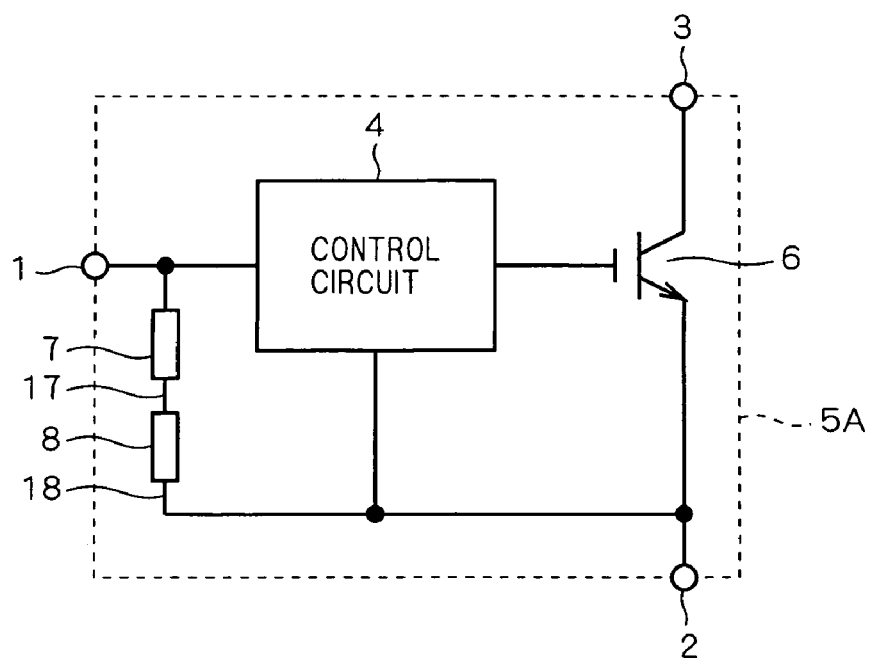
FIG. 1 is a circuit diagram illustrating a composition of a semiconductor device in which an IGBT is built according to a preferred embodiment 1 of the present invention.

FIG. 1 is a circuit diagram illustrating a composition of a semiconductor device 5A in which an IGBT is built according to the preferred embodiment 1 of the present invention. As shown in FIG. 1, the semiconductor device 5A includes a control input terminal 1 (an input terminal), a GND terminal 2 (a reference terminal) and an output terminal 3 which are able to give and receive a signal from outside, and includes a control circuit 4, an IGBT 6, a ground resistance 7 (a first resistance) and a temperature compensation resistance 8 (a second resistance) inside.

The control circuit 4 is connected to the control input terminal 1, the GND terminal 2 and a gate electrode of the IGBT 6 and drives and controls the IGBT 6 on the basis of an input signal obtained by the control input terminal 1. A collector of the IGBT 6 is connected to the output terminal 3, and its emitter is connected to the GND terminal 2.

In the meantime, the ground resistance 7 and the temperature compensation resistance 8 are connected in series to each other between the control input terminal 1 and the GND terminal 2. That is to say, one end of the ground resistance 7 is connected to the control input terminal 1, its other end is connected to a temperature compensation resistance electrode 17 of the temperature compensation resistance 8 and a temperature compensation resistance electrode 18 of the temperature compensation resistance 8 is connected to the GND terminal 2. A resistance part corresponding to the control input terminal 1 is formed of these ground resistance 7 and the temperature compensation resistance 8, and a combined resistance of this resistance part defines an input impedance of the control input terminal 1.

The ground resistance 7 is provided to improve an impedance accuracy for the control input terminal 1, and the temperature compensation resistance 8 is characterized in that it has a temperature dependence countering a change of the ground resistance 7 caused by an ambient temperature.

A polysilicon resistance provided on an insulating film formed on a semiconductor substrate in which the IGBT 6 is provided is employed as the ground resistance 7. The reason is that the ground resistance 7 is an element connected directly to the control input terminal 1 and an influence of an element parasitically generated between the ground resistance 7 and the semiconductor substrate in which the control circuit 4, the IGBT 6 and so on are formed should be avoided.

The polysilicon resistance which is to be a ground resistance 7 is synchronously formed during a process employed in case of forming a switching element to constitute the IGBT 6 or the control circuit 4. However, the polysilicon resistance has the temperature dependence that a resistance value changes according to the ambient temperature. It is conceivable that a metal thin film resistance is formed as a resistance of small temperature dependence, however, a manufacturing process should be added to form only a resistance element, and then a manufacturing cost increases, thus it is not a practical way.

The polysilicon resistance has generally a negative temperature dependence that the resistance value reduces according to a rise of the ambient temperature (a first temperature dependence), however, dependence corresponding to the ambient temperature can be retained small on the whole by combining a positive temperature dependence that the resistance value rises according to the rise of the ambient temperature so as to countering this negative temperature dependence (a second temperature dependence).

That is to say, the combined resistance combining the ground resistance 7 and the temperature compensation resistance 8 becomes a resistance of small dependence corresponding to the ambient temperature by employing the resistance having the positive temperature dependence described above as the temperature compensation resistance 8.

A diffusion resistance obtained by injecting an impurity into a semiconductor substrate such as a Si substrate and so on in which the IGBT 6 is formed and performing a diffusion operation is employed as the temperature compensation resistance 8 having the positive temperature dependence described above. The diffusion resistance has the positive temperature dependence, thus the combined resistance of small temperature dependence can be obtained by connecting the ground resistance 7 composed of the polysilicon resistance to the temperature compensation resistance 8 composed of the diffusion resistance in series (in case of FIG. 1) or in parallel.

In the meantime, the diffusion resistance is formed on the same semiconductor substrate as the IGBT 6, thus it has the parasitic element corresponding to the semiconductor substrate, therefore, a measure to prevent a malfunction of the parasitic element is necessary in a state of normal use and in abnormal state, too.

Figure 2:
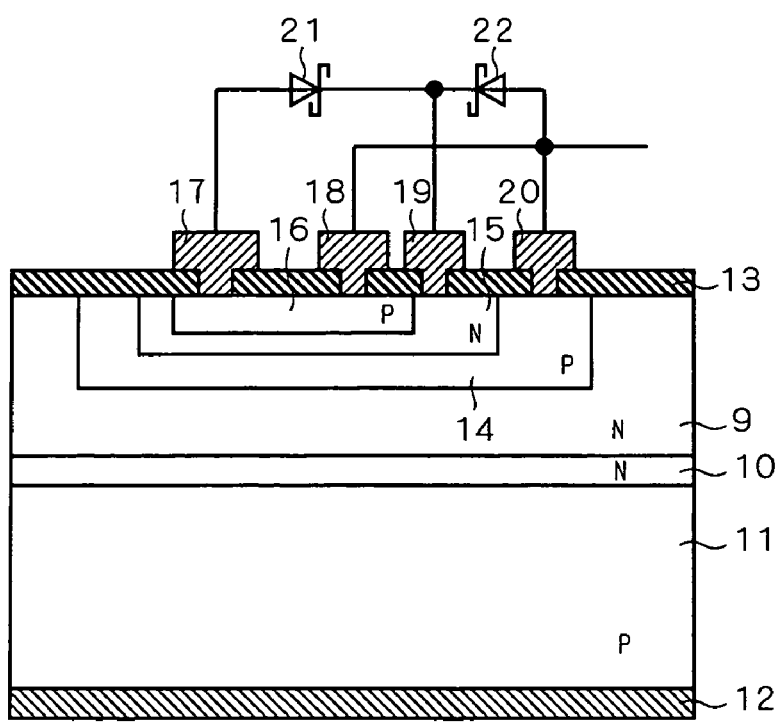
FIG. 2 is a cross-sectional view illustrating a structure of a diffusion resistance to be a temperature compensation resistance in FIG. 1.

FIG. 2 is a cross-sectional view illustrating a structure of the diffusion resistance to be the temperature compensation resistance 8. As shown in FIG. 2, a N type semiconductor region 10 is formed on a P type semiconductor substrate 11, a N type semiconductor region 9 is formed on the N type semiconductor region 10, a P type semiconductor region 14 is formed selectively on an upper layer of the N type semiconductor region 9, a N type semiconductor region 15 is formed selectively on an upper layer of the P type semiconductor region 14 and a P type semiconductor region 16 for the temperature compensation resistance is formed selectively on an upper layer of the N type semiconductor region 15.

An insulating layer 13 is formed on a surface of the N type semiconductor region 9 including the P type semiconductor region 14, the N type semiconductor region 15 and the P type semiconductor region 16, the temperature compensation resistance electrode 17 is formed with being in contact with part of a surface of the P type semiconductor region 16, a temperature compensation resistance electrode 18 is formed with being in contact with other part of the P type semiconductor region 16, a N type semiconductor region electrode 19 is formed with being in contact with part of a surface of the N type semiconductor region 15 and a P type semiconductor region electrode 20 is formed with being in contact with part of a surface of the P type semiconductor region 14. These electrodes 17 to 20 are formed with penetrating the insulating layer 13, respectively. Moreover, a metalized layer 12 is formed on other main surface of the P type semiconductor substrate 11. A selective penetrating treatment of the insulating layer 13 described above is performed by providing holes in the insulating layer 13 locally by an etching processing and so on.

Furthermore, a schottky barrier diode 21 is provided between the temperature compensation resistance electrode 17 and the N type semiconductor region electrode 19, regarding a side of the temperature compensation resistance electrode 17 as an anode and a side of the N type semiconductor region electrode 19 as a cathode, and moreover, a schottky barrier diode 22 is provided between the N type semiconductor region electrode 19 and the P type semiconductor region electrode 20, regarding a side of the P type semiconductor region electrode 20 as an anode and a side of the N type semiconductor region electrode 19 as a cathode. Besides, the schottky barrier diodes 21 and 22 are formed separately from the temperature compensation resistance 8 (the P type semiconductor region 16), however, they are typically illustrated for convenience of explanation.

In FIG. 2, the temperature compensation resistance 8 to be the diffusion resistance is composed of the P type semiconductor region 14, the N type semiconductor region 15, the P type semiconductor region 16 and the temperature compensation resistance electrodes 17 and 18, and the P type semiconductor region 16 provided between the temperature compensation resistance electrodes 17 and 18 functions as a substantial diffusion resistance constituent.

It is necessary that a reverse bias is constantly applied to the P type semiconductor region 16 and the N type semiconductor region 15 (a situation that a potential of the N type semiconductor region 15 is higher than that of the P type semiconductor region 16) so that the P type semiconductor region 16 functions normally as the resistance. The reason is that when a forward bias is applied to a PN junction, a parasitic transistor (n PNP transistor composed of the P type semiconductor region 14, the N type semiconductor region 15 and the P type semiconductor region 16, or a NPN transistor composed of the N type semiconductor region 15, the P type semiconductor region 14 and the N type semiconductor region 9) works and can cause a malfunction between the PN junction and the other region.

Moreover, other current route flowing through the schottky barrier diodes 21 and 22 is provided by setting the schottky barrier diode 21 in a forward voltage characteristic lower than a first PN junction between the P type semiconductor region 16 and the N type semiconductor region 15 and setting the schottky barrier diode 22 in a forward voltage characteristic lower than a second PN junction between the P type semiconductor region 14 and the N type semiconductor region 15, thus it is possible to by-pass the current flowing through the first and the second PN junctions described above and control the action of the parasitic element caused by the first and the second PN junctions described above.

That is to say, the schottky barrier diode 21 is employed for controlling the forward bias of the first PN junction described above and the schottky barrier diode 22 is employed for controlling the forward bias of the second PN junction described above and thus the P type semiconductor region 16 or the P type semiconductor region 14 which is in contact with the N type semiconductor region 15 are composed not to apply the forward bias constantly.

Figure 3:
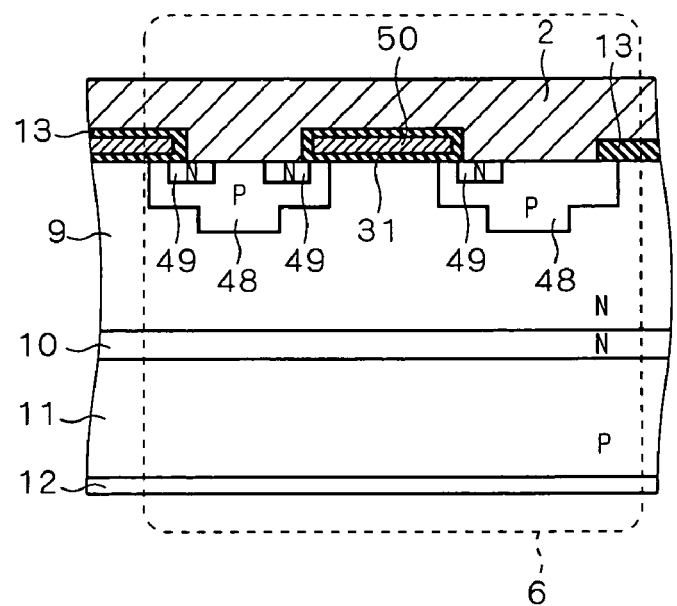
FIG. 3 is a cross-sectional view illustrating a structure of the IGBT in FIG. 1.

FIG. 3 is a cross-sectional view illustrating a structure of the IGBT 6. As shown in FIG. 3, the N type semiconductor region 10 is formed on the P type semiconductor substrate 11, and the N type semiconductor region 9 is formed on the N type semiconductor region 10. Moreover, a P type semiconductor region 48 is formed on an upper layer of the N type semiconductor region 9, and the N type semiconductor region 49 is formed selectively on a surface of the P type semiconductor region 48.

Moreover, an IGBT gate electrode 50 is formed on an upper side between the P type semiconductor regions 48 and 48 adjacent to each other over part of the N type semiconductor region 49 and part of the P type semiconductor region 48 in one P type semiconductor region 48, over part of the N type semiconductor region 9 and over part of the P type semiconductor region 48 and part of the N type semiconductor region 49 in other P type semiconductor region 48 through a gate insulating film 31. The periphery of the IGBT gate electrode 50 is insulated by the insulating layer 13.

Moreover, the GND terminal 2 is formed on the P type semiconductor region 48 and the N type semiconductor region 49 where the insulating layer 13 is not formed, and the metalized layer 12 is formed on the other main surface of the P type semiconductor substrate 11. Besides, with regard to a relationship between FIG. 2 and FIG. 3, the parts having identical codes are composed of the same elements and formed synchronously, as a matter of course.

When the IGBT gate electrode 50 is constituted with employing polysilicon, simplification of the manufacturing process can be performed by forming it and the polysilicon resistance constituting the ground resistance 7 synchronously.

In this manner, in the preferred embodiment 1, the combined resistance of small temperature dependence can be provided between the control input terminal 1 and the GND terminal 2 by combining the ground resistance 7 composed of the polysilicon resistance with the temperature compensation resistance 8 composed of the diffusion resistance, and the improvement in the accuracy of the impedance of the control input terminal 1 can be performed. At this moment, a decrease of the manufacturing cost can be performed by forming the polysilicon resistance to be the ground resistance 7 synchronously with the IGBT gate electrode 50 of the IGBT 6 or by forming the switching element such as a MOS transistor and so on employing in the control circuit 4 synchronously with the P type semiconductor region 14, the N type semiconductor region 15 and the P type semiconductor region 16 which constitute the temperature compensation resistance 8, or the like.

In addition, a negative effect caused by providing the temperature compensation resistance 8 is positively avoided by performing a malfunction control of the parasitic element generated in the diffusion resistance constituting the temperature compensation resistance 8 by providing the schottky barrier diodes 21 and 22.

(Other Composition of the Diffusion Resistance)

In the structure illustrated in FIG. 2, an example of forming the temperature compensation resistance 8 by the P type diffusion region is illustrated, however, the temperature compensation resistance 8 can also be formed by the N type diffusion region, as described below.

Figure 4:
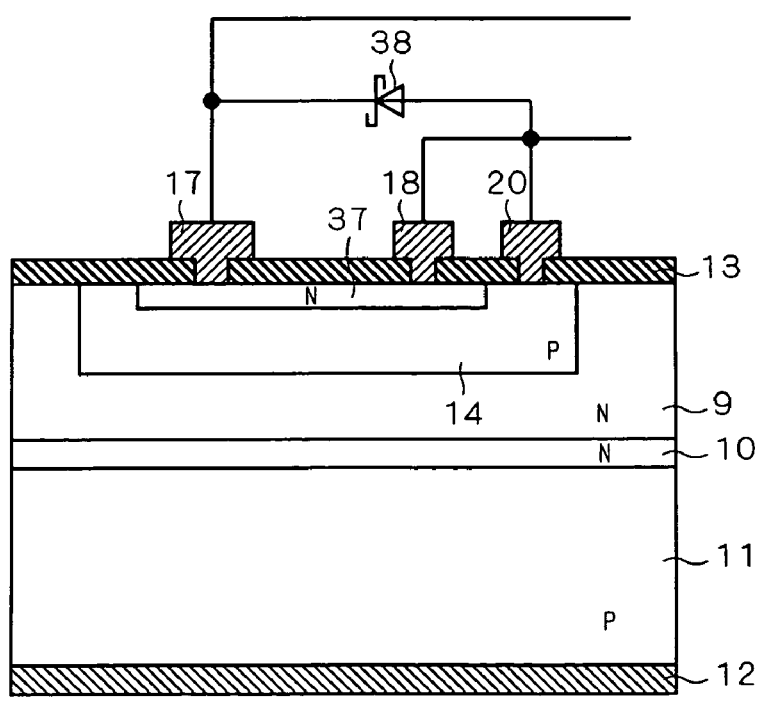
FIG. 4 is a cross-sectional view illustrating other structure of the diffusion resistance to be the temperature compensation resistance in FIG. 1 (No. 1).

FIG. 4 is a cross-sectional view illustrating other structure of the diffusion resistance to be the temperature compensation resistance 8 (No. 1). As shown in FIG. 4, the N type semiconductor region 10 is formed on the P type semiconductor substrate 11, the N type semiconductor region 9 is formed on the N type semiconductor region 10, the P type semiconductor region 14 is formed selectively on the upper layer of the N type semiconductor region 9 and a N type semiconductor region 37 is formed selectively in the surface of the P type semiconductor region 14.

The insulating layer 13 is formed on a surface of the N type semiconductor region 9 including the P type semiconductor region 14 and the N type semiconductor region 37, the temperature compensation resistance electrode 17 is formed with being in contact with part of a surface of the N type semiconductor region 37, the temperature compensation resistance electrode 18 is formed with being in contact with other part of the N type semiconductor region 37 and the P type semiconductor region electrode 20 is formed with being in contact with the part of the surface of the P type semiconductor region 14. These electrodes 17, 18 and 20 are formed with penetrating the insulating layer 13, respectively. Moreover, the metalized layer 12 is formed on the other side of the main surface of the P type semiconductor substrate 11.

Furthermore, a schottky barrier diode 38 is provided between the temperature compensation resistance electrode 17 and the P type semiconductor region electrode 20, regarding the side of the P type semiconductor region electrode 20 as the anode and the side of the temperature compensation resistance electrode 17 as the cathode. Besides, the schottky barrier diode 38 is formed separately from the temperature compensation resistance 8 (the N type semiconductor region 37), however, they are typically illustrated for convenience of explanation.

In FIG. 4, the temperature compensation resistance 8 to be the diffusion resistance is composed of the P type semiconductor region 14, the N type semiconductor region 37 and the temperature compensation resistance electrodes 17 and 18, and the N type semiconductor region 37 provided between the temperature compensation resistance electrodes 17 and 18 functions as a substantial diffusion resistance constituent.

It is necessary that the reverse bias is applied to the N type semiconductor region 37 and the P type semiconductor region 14 (a situation that a potential of the N type semiconductor region 37 is higher than that of the P type semiconductor region 14) so that the N type semiconductor region 37 functions normally as the resistance. The reason is that when the forward bias is applied to the PN junction, the parasitic transistor (a NPN transistor composed of the N type semiconductor region 37, the P type semiconductor region 14 and the N type semiconductor region 9) works and can cause the malfunction between the PN junction and the other region.

Moreover, other current route flowing through the schottky barrier diode 38 is provided by setting the schottky barrier diode 38 in a forward voltage characteristic lower than a PN junction between the N type semiconductor region 37 and the P type semiconductor region 14, thus it is possible to by-pass the current flowing in the PN junction described above and control the action of the parasitic element caused by the PN junction described above. In this manner, the schottky barrier diode 38 is employed for controlling the forward bias of the PN junction described above.

Figure 5:
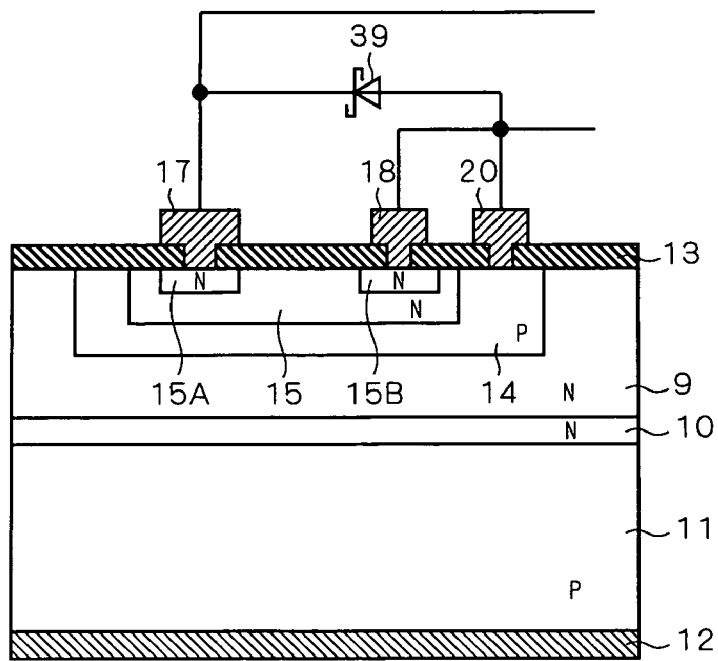
FIG. 5 is a cross-sectional view illustrating other structure of the diffusion resistance to be the temperature compensation resistance in FIG. 1 (No. 2).

FIG. 5 is a cross-sectional view illustrating other structure of the diffusion resistance to be the temperature compensation resistance 8 (No. 2). As shown in FIG. 5, the N type semiconductor region 10 is formed on the P type semiconductor substrate 11, the N type semiconductor region 9 is formed on the N type semiconductor region 10, the P type semiconductor region 14 is formed selectively on the upper layer of the N type semiconductor region 9, the N type semiconductor region 15 is formed selectively on the upper layer of the P type semiconductor region 14 and N type semiconductor regions 15A and 15B are formed selectively in the surface of the N type semiconductor region 15. Besides, the N type semiconductor region 15 is a region formed synchronously with a well region of a PMOS transistor formed on the other region. Moreover, a N type impurity concentration of the N type semiconductor regions 15A and 15B is set to be higher than that of the N type semiconductor region 15.

The insulating layer 13 is formed on the surface of the N type semiconductor region 9 including the P type semiconductor region 14, the N type semiconductor region 15, the N type semiconductor region 15A and the N type semiconductor region 15B, the temperature compensation resistance electrode 17 is formed with being in contact with part of a surface of the N type semiconductor region 15A, the temperature compensation resistance electrode 18 is formed with being in contact with part of a surface of the N type semiconductor region 15B and a P type semiconductor region electrode 20 is formed with being in contact with the part of the surface of the P type semiconductor region 14. These electrodes 17, 18 and 20 are formed with penetrating the insulating layer 13, respectively. Moreover, a metalized layer 12 is formed on other side of the main surface of the P type semiconductor substrate 11.

Furthermore, in the same manner as the schottky barrier diode 38 illustrated in FIG. 4, a schottky barrier diode 39 is provided between the temperature compensation resistance electrode 17 and the P type semiconductor region electrode 20, regarding the side of the P type semiconductor region electrode 20 as the anode and the side of the temperature compensation resistance electrode 17 as the cathode.

In FIG. 5, the temperature compensation resistance 8 to be the diffusion resistance is composed of the P type semiconductor region 14, the N type semiconductor region 15, 15A and 15B and the temperature compensation resistance electrodes 17 and 18, and the N type semiconductor region 15 provided between the temperature compensation resistance electrodes 17 and 18 functions as the substantial diffusion resistance constituent. The N type semiconductor region 15 is formed synchronously with the well region of the PMOS transistor, thus the impurity concentration is comparatively low, therefore, the N type semiconductor regions 15A and 15B of low impurity concentration comparatively is provided in the surface of the N type semiconductor region 15 for connecting electrically with the temperature compensation resistance electrodes 17 and 18.

It is necessary that the reverse bias is applied to the N type semiconductor region 15 and the P type semiconductor region 14 (a situation that the potential of the N type semiconductor region 15 is higher than that of the P type semiconductor region 14) so that the N type semiconductor region 15 functions normally as the resistance. The reason is that when the forward bias is applied to the PN junction, the parasitic transistor (the NPN transistor composed of the N type semiconductor region 15, the P type semiconductor region 14 and the N type semiconductor region 9) works and can cause the malfunction between the PN junction and the other region.

Moreover, the other current route flowing through the schottky barrier diode 39 is provided by setting the schottky barrier diode 39 in the forward voltage characteristic lower than the PN junction provided between the N type semiconductor region 15 and the P type semiconductor region 14, thus it is possible to by-pass the current flowing in the PN junction described above and control the action of the parasitic element caused by the PN junction described above. In this manner, the schottky barrier diode 39 is employed for controlling the forward bias of the PN junction described above.

<Preferred Embodiment 2>

Figure 6:
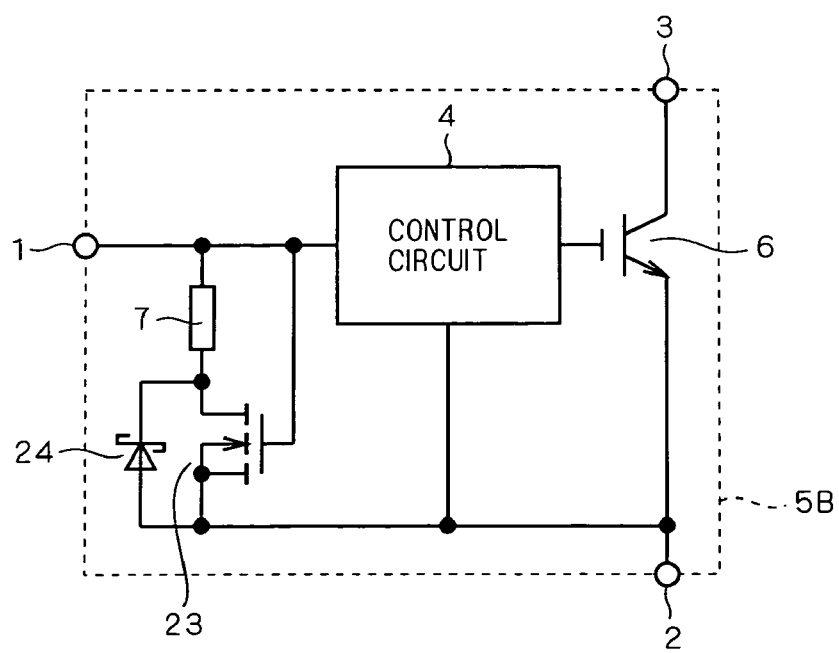
FIG. 6 is a circuit diagram illustrating a composition of a semiconductor device in which an IGBT is built according to a preferred embodiment 2 of the present invention.

FIG. 6 is a circuit diagram illustrating a composition of a semiconductor device 5B in which an IGBT is built according to the preferred embodiment 2 of the present invention. As shown in FIG. 6, a NMOS transistor (a N type MOSFET) 23 and a schottky barrier diode 24 is interposed in parallel instead of the temperature compensation resistance 8 in the preferred embodiment 1 between the other terminal of the ground resistance 7 and the GND terminal 2. That is to say, an anode of the schottky barrier diode 24 is connected to the GND terminal 2, and its cathode is connected to the other terminal of the ground resistance 7, and moreover, a drain of the NMOS transistor 23 is connected to the other terminal of the ground resistance 7, and its source is connected to the GND terminal 2. Moreover, a gate electrode of the NMOS transistor 23 is connected directly to the control input terminal 1. Besides, other composition is similar to that of the preferred embodiment 1 illustrated in FIG. 1.

Accordingly, in the preferred embodiment 2, a resistance part corresponding to the control input terminal 1 is formed by the ground resistance 7 (the first resistance) and (an ON resistance (a second resistance) of) the NMOS transistor 23, and a combined resistance of this resistance part defines an input impedance of the control input terminal 1.

The ON resistance of the NMOS transistor 23 functions as equal as the temperature compensation resistance 8 of the preferred embodiment 1. That is to say, the ON resistance (a channel resistance) of the NMOS transistor 23 has the positive temperature dependence, thus it has an effect of countering the negative temperature dependence of the ground resistance 7, in the same manner as the temperature compensation resistance 8. The schottky barrier diode 24 is employed to prevent the malfunction of the parasitic element existing in the drain of the NMOS transistor 23. Besides, when an input voltage obtained from the control input terminal 1 becomes a voltage that indicates an active state of the IGBT 6, the NMOS transistor 23 is set to have a threshold voltage to be ON state.

Figure 7:
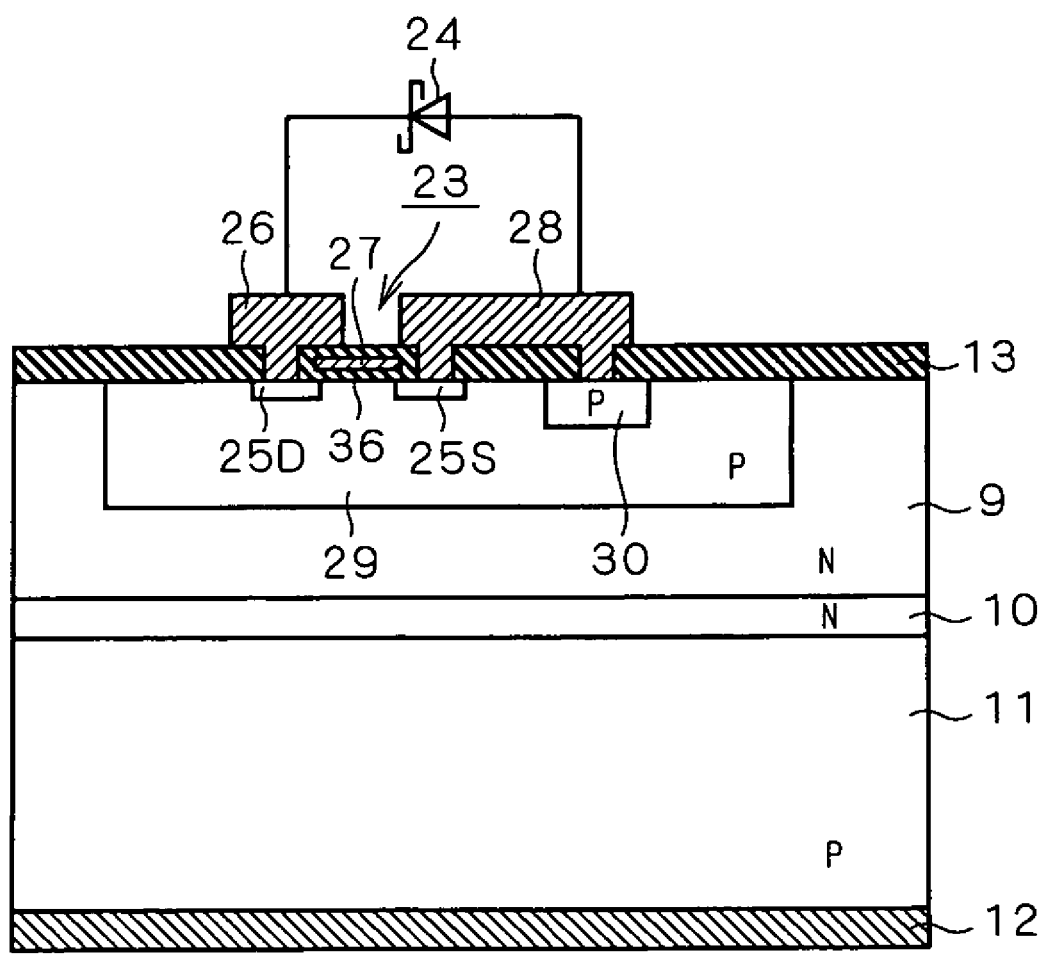
FIG. 7 is a cross-sectional view illustrating a structure of a NMOS transistor in FIG. 6.

FIG. 7 is a cross-sectional view illustrating a structure of the NMOS transistor 23. As shown in FIG. 7, the N type semiconductor region 10 is formed on the P type semiconductor substrate 1, the N type semiconductor region 9 is formed on the N type semiconductor region 10, a P type semiconductor region 29 is formed selectively on the upper layer of the N type semiconductor region 9 and a N type drain region 25D, a N type source region 25S and a P type semiconductor region 30 are formed selectively on a surface of the P type semiconductor region 29. The P type semiconductor region 30 is employed as a contact region of the P type semiconductor region 29, thus a P type impurity concentration is set to be higher than that of the P type semiconductor region 29.

Moreover, a gate electrode 27 is formed on the surface of the P type semiconductor region 29 provided between the N type drain region 25D and the N type source region 25S through a gate insulating film 36. Accordingly, the NMOS transistor 23 is composed of the N type drain region 25D, the N type source region 25S, the P type semiconductor region 29 (the channel region) provided between the N type drain region 25D and the N type source region 25S, a drain electrode 26, the gate electrode 27 and a source electrode 28. Besides, the source electrode 28 functions as a back gate electrode of the NMOS transistor 23 by being connected electrically to the P type semiconductor region 30.

The insulating layer 13 is formed on the surface of the N type semiconductor region 9 and the P type semiconductor region 29 except for part of the N type drain region 25D, part of the N type source region 25S and part of the P type semiconductor region 30. Moreover, the drain electrode 26 is formed on the N type drain region 25D, and the source electrode 28 is formed on the N type source region 25S and the P type semiconductor region 30. The drain electrode 26 and the source electrode 28 are formed with penetrating the insulating layer 13, respectively. Moreover, the anode of the schottky barrier diode 24 (illustrated typically in FIG. 7) formed separately from the NMOS transistor 23 is connected with the source electrode 28 and its cathode is connected to the drain electrode 26.

With reference to the structure of the NMOS transistor 23 illustrated in FIG. 7 and the structure of the IGBT 6 illustrated in FIG. 3, the parts having identical codes are composed of the same elements and formed synchronously. In addition, when the P type semiconductor region 48 in the IGBT 6 is formed, the N type semiconductor region electrodes 19 and 20 in the NMOS transistor 23 is formed, and when the N type semiconductor region 49 in the IGBT 6 is formed, the N type drain region 25D and the N type source region 25S are formed.

As shown in FIG. 7, a PN junction is formed between the N type drain region 25D and the N type source region 25S and the P type semiconductor regions 29 and 30 (the back gate region of the NMOS transistor 23). This PN junction is employed normally with applying the reverse bias. However, when the forward bias is applied to this PN junction, the parasitic element formed between the PN junction and other semiconductor region works, thus there is a risk of a breakdown of elements employed actually.

In the preferred embodiment 2, in case that the forward bias is applied to the PN junction formed between the P type semiconductor regions 29 and 30 and the N type drain/source regions 25D and 25S, the other current route flowing through the schottky barrier diode 24 is provided by providing the schottky barrier diode 24, thus it is possible to by-pass the current flowing in that PN junction and control effectively the malfunction of the parasitic element.

In this manner, the semiconductor device 5B in the preferred embodiment 2 has an effect similar to the semiconductor device 5A in the preferred embodiment 1 by employing the ON resistance of the NMOS transistor 23 in which the gate electrode is directly connected to the control input terminal 1 as the temperature compensation resistance of the ground resistance 7, and in addition, in the same manner as the preferred embodiment 1, the temperature compensation resistance can be formed with smaller forming area as compared with a case of employing the diffusion resistance. Furthermore, the parasitic element incidental to the NMOS transistor 23 can be controlled effectively by the schottky barrier diode 24.

<Preferred Embodiment 3>

FIG. 8 is a circuit diagram illustrating a composition of a semiconductor device 5C in which an IGBT is built according to the preferred embodiment 3 of the present invention. As shown in FIG. 8, n($\geq$1) set(s) of (a) combined resistance part(s) RC1 to RCn is/are provided in parallel between the other terminal of the ground resistance 7 and the GND terminal 2 instead of the resistance part composed of the ground resistance 7 and the temperature compensation resistance 8 of the preferred embodiment 1.

A combined resistance part RCi (one of 1 to n is applied to i) is composed of a ground resistance RGi, a NMOS transistor QNi, a pull-up resistance RPi (a third resistance) and a zener diode TDi, one terminal of the ground resistance RGi is connected to the control input terminal 1, its other terminal is connected to a drain of the NMOS transistor QNi and a source of the NMOS transistor QNi is connected to the GND terminal 2. One terminal of the pull-up resistance RPi is connected to the control input terminal 1, its other terminal is connected to a gate of the NMOS transistor QNi and a cathode of the zener diode TDi and an anode of the zener diode TDi is connected with the GND terminal 2. Besides, the pull-up resistances RP1 to RPn are set to have a resistance value sufficiently larger than that of the ground resistances RG1 to RGn.

In such a composition, in case that the zener diode TDi shows an original function without a short-circuit, the NMOS transistor QNi turns to be ON beyond the threshold voltage of the NMOS transistor QNi, when the input voltage given to the control input terminal 1 becomes the voltage that indicates the active state of the IGBT 6.

When an excessive current is made to flow in a zener diode, a local heat is generated, and it is possible to short-circuit a PN junction (zener zap). Accordingly, it is possible to set only (n–k) sets of the NMOS transistors out of the NMOS transistors QN1 to QNn to be ready for ON state by short-circuiting selectively a predetermined number k (k=0 to n) of the zener diodes out of the zener diodes TD1 to TDn.

Accordingly, in an inspection process of the semiconductor device 5C in the preferred embodiment 3, an intended input impedance can be set with high accuracy regardless of an influence of a variation in a process of manufacturing the semiconductor device by setting the number of the NMOS transistor being ready for ON state, as described above.

In the preferred embodiment 3, the resistance value of the combined resistance part RCi is determined by a combined resistance of the ground resistance RGi and an ON resistance of the NMOS transistor QNi, however, it is also applicable to set the ON resistance of the NMOS transistor QNi to have sufficiently a smaller value than that of the ground resistance RGi and place the diffusion resistance (the temperature compensation resistance 8) described in the preferred embodiment 1 between a drain of the NMOS transistor QNi and the other terminal of the ground resistance RGi. In this case, a substantial resistance value of the combined resistance part RCi is determined by a combined resistance of the ground resistance 7 and the diffusion resistance.

Moreover, it is also applicable to place a schottky barrier diode to prevent the malfunction of the parasitic element between a drain and a source of the NMOS transistors QN1 to QNn.

<Preferred Embodiment 4>

FIG. 9 is a circuit diagram illustrating a composition of a semiconductor device 5D in which an IGBT is built according to the preferred embodiment 4 of the present invention. As shown in FIG. 9, a NMOS transistor 41, diodes 42 and 43, a constant voltage diode 44 and a resistance 45 (output terminal resistance part) are provided instead of the temperature compensation resistance 8 in the preferred embodiment 1.

A drain of the NMOS transistor 41 is connected to the other terminal of the ground resistance 7, and its source is connected to the GND terminal 2. An anode of the diode 42 which is an input terminal diode is connected to the control input terminal 1, and its cathode is connected to a gate of the NMOS transistor 41.

Moreover, one terminal of the resistance 45 is connected to the output terminal 3. An anode of the diode 43 which is an output terminal diode is connected to other terminal of the resistance 45, and its cathode is connected to a gate of the NMOS transistor 41. An anode of the constant voltage diode 44 is connected to the GND terminal 2, and its cathode is connected to the other terminal of the resistance 45. Other composition is similar to that of the preferred embodiment 1 illustrated in FIG. 1.

In such a composition, when the input voltage given to the control input terminal 1 becomes the voltage that indicates the active state of the IGBT 6 (the voltage is set to be equal or larger than the sum of a threshold voltage of the NMOS transistor 41 and a forward voltage drop of the diode 42), a gate potential of the NMOS transistor 41 exceeds the threshold voltage of the NMOS transistor 41, and the NMOS transistor 41 turns to be ON and functions as a temperature compensation resistance, in the same manner as that in the preferred embodiment 2.

Moreover, when the input voltage given to the control input terminal 1 becomes the voltage that indicates an inactive state of the IGBT 6 (the voltage is set to be smaller than the sum of the threshold voltage of the NMOS transistor 41 and the forward voltage drop of the diode 42), the gate potential of the NMOS transistor 41 falls below the threshold voltage of the NMOS transistor 41.

In the meantime, a load to be driven is connected to the output terminal 3, therefore, when the IGBT 6 is in OFF state, the potential of the output terminal 3 is pulled up to a source voltage. Accordingly, a potential large enough to make the NMOS transistor 41 be in ON state is impressed into the gate of the NMOS transistor 41 as an output-related voltage given from an output-related voltage giving part composed of the resistance 45 and the diode 43 (a voltage obtained as a result of the output voltage which is obtained by the output terminal 3 dropping as much as the amount of a voltage drop by the diode 43). Accordingly, in case that the load is normal, the NMOS transistor 41 turns to be ON state, even in case that the input voltage given to the control input terminal 1 becomes the voltage that indicates the inactive state of the IGBT 6. Besides, the constant voltage diode 44 is provided to control a rise of an anode potential of the diode 43.

However, in case that a defect such as a disconnection and so on occurs in the load, the potential of the output terminal 3 falls sharply below the source potential, and the gate potential of the NMOS transistor 41 given as the output-related voltage described above cannot make the NMOS transistor 41 be in ON state.

Besides, one of the input-related voltage corresponding to the input voltage obtained by the control input terminal 1 or the output-related voltage related to the output voltage obtained by the output terminal 3 is given to the gate electrode of the NMOS transistor 41 by a rectifying action by the diodes 42 and 43. That is to say, one of the input-related voltage obtained as a result of the input voltage dropping as much as the amount of a voltage drop by the diode 42 or the output-related voltage obtained as a result of the output voltage dropping as much as the amount of the voltage drop by the diode 43 is given to the gate electrode of the NMOS transistor 41 without an influence of the other voltage. As a result, ON and OFF of the NMOS transistor 41 can be controlled without a malfunction.

Accordingly, in case that the input voltage given to the control input terminal 1 becomes the voltage that indicates the inactive state of the IGBT 6, it is possible to detect that the load connected to the output terminal 3 is not normal, when the control input terminal 1 comes to be in a high-impedance state (by reason of the NMOS transistor 41 being in OFF state).

In this manner, the semiconductor device 5D in the preferred embodiment 4 has an effect similar to that in the preferred embodiment 2, and moreover, it also has an effect that it can perform a failure detection of the load connected to the output terminal 3.

Besides, it is an object of the constant voltage diode 44 to control an occurrence of a high voltage, thus it is necessary to employ the zener diode, however, the diodes 42 and 43 can be realized with employing diodes instead of the zener diode, too.

Moreover, in the same manner as the preferred embodiment 2, the schottky barrier diode to prevent the malfunction of the parasitic element can be provided between a drain and a source of the NMOS transistor 41, too.

<Preferred Embodiment 5>

FIG. 10 is a circuit diagram illustrating a composition of a semiconductor device 5E in which an IGBT is built according to the preferred embodiment 5 of the present invention. As shown in FIG. 10, a collector voltage detecting element 46 (an output terminal resistance part) is provided instead of the resistance 45 in the preferred embodiment 4. One terminal of the collector voltage detecting element 46 is connected to the output terminal 3, and a detection collector voltage output terminal 47 which is other terminal is connected to the anode of the diode 43 and the cathode of the constant voltage diode 44. Besides, other composition is similar to that in the preferred embodiment 4 illustrated in FIG. 9.

Figure 11:
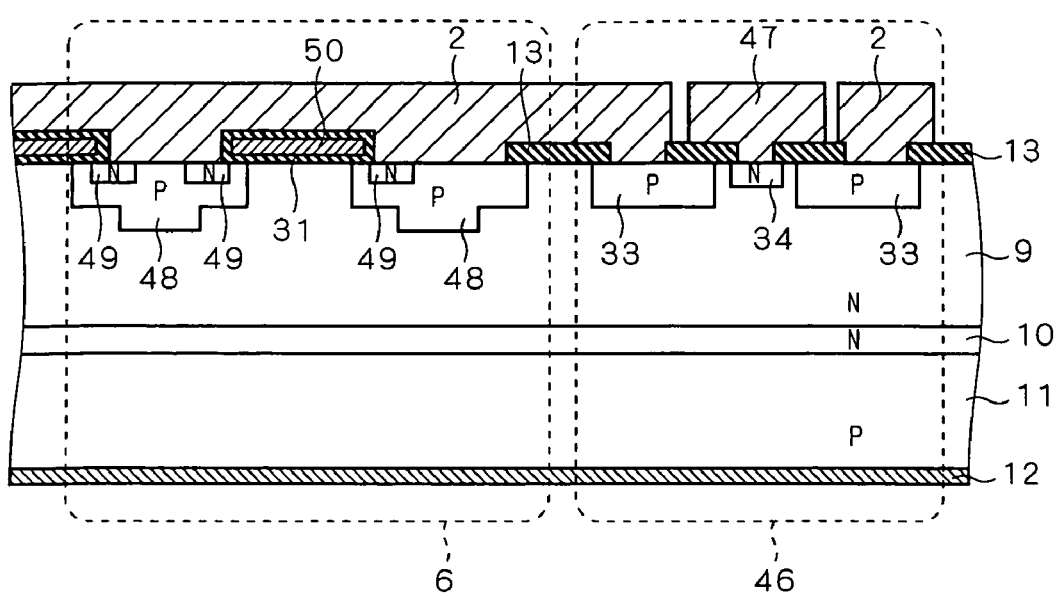
FIG. 11 is a cross-sectional view illustrating a structure of a collector voltage detecting element in FIG. 10.

FIG. 11 is a cross-sectional view illustrating a structure of the collector voltage detecting element 46. As shown in FIG. 11, the IGBT 6 and the collector voltage detecting element 46 are formed in a unified manner on the P type semiconductor substrate 11. The structure of the IGBT 6 is similar to that illustrated in FIG. 3, thus the description is omitted, and a structure of the collector voltage detecting element 46 is described hereinafter.

The N type semiconductor region 10 is formed on the P type semiconductor substrate 11, and the N type semiconductor region 9 is formed on the N type semiconductor region 10. Moreover, a P type semiconductor region 33 and a N type semiconductor region 34 are formed selectively on the upper layer of the N type semiconductor region 9. A N type impurity concentration of the N type semiconductor region 34 is set to be high as compared with that of the N type semiconductor region 9 to reduce a contact resistance with the detection collector voltage output terminal 47. The P type semiconductor region 33 has a shape surrounding the N type semiconductor region 34 with a plain view and is formed adjacent to the N type semiconductor region 34.

The insulating layer 13 is formed on the surface of the N type semiconductor region 9 except for part of the P type semiconductor region 33 and part of the N type semiconductor region 34, the GND terminal 2 is formed directly on part of a surface of the P type semiconductor region 33 and the detection collector voltage output terminal 47 is formed directly on part of a surface of the N type semiconductor region 34. The GND terminal 2 and the detection collector voltage output terminal 47 are formed with penetrating the insulating layer 13.

With reference to the structure of the collector voltage detecting element 46 and the structure of the IGBT 6, the parts having identical codes are composed of the same elements and formed synchronously. In addition, when the P type semiconductor region 48 in the IGBT 6 is formed, the P type semiconductor region 33 in the collector voltage detecting element 46 is formed, and when the N type semiconductor region 49 in the IGBT 6 is formed, the N type semiconductor region 34 is formed.

In such a composition, a collector voltage of the IGBT 6 (a voltage in a side of the metalized layer 12) becomes high, the reverse bias is applied to a PN junction formed between the N type semiconductor region 9 and the P type semiconductor region 33, thus a depletion layer is formed in the PN junction described above. An effect of a junction FET (described as a "JFET" hereinafter) works that the higher the collector voltage becomes, the wider the depletion layer becomes and then an electric resistance between the P type semiconductor region 33 and the collector of the IGBT 6 becomes higher. In a situation that a high voltage is given to the collector of the IGBT 6 (the output terminal 3), even if a potential of the detection collector voltage output terminal 47 is suppressed to be low by the constant voltage diode 44, the excessive current does not flow in the collector voltage detecting element 46 by the JFET function of the collector voltage detecting element 46.

That is to say, the collector voltage detecting element 46 functions as equal as a resistance of enormous resistance value, when the high voltage is given to the collector of the IGBT 6.

In this manner, the semiconductor device 5E in the preferred embodiment 5 has an effect that it can control the temperature dependence and perform the failure detection of the load, in the same manner as that in the preferred embodiment 4. In addition, it is necessary to employ the resistance 45 having the enormous resistance value to control the current flowing when the high voltage is given to the output terminal 3 as the output voltage in the preferred embodiment 4, however, in the preferred embodiment 5, the similar effect can be realized with smaller forming area by employing the collector voltage detecting element 46 instead of the resistance 45 and thus, it can also have an effect that the manufacturing cost decreases.

Moreover, in the same manner as the preferred embodiment 2, the schottky barrier diode to prevent the malfunction of the parasitic element can be provided between a drain and a source of the NMOS transistor 41, too.

<Preferred Embodiment 6>

Figure 12:
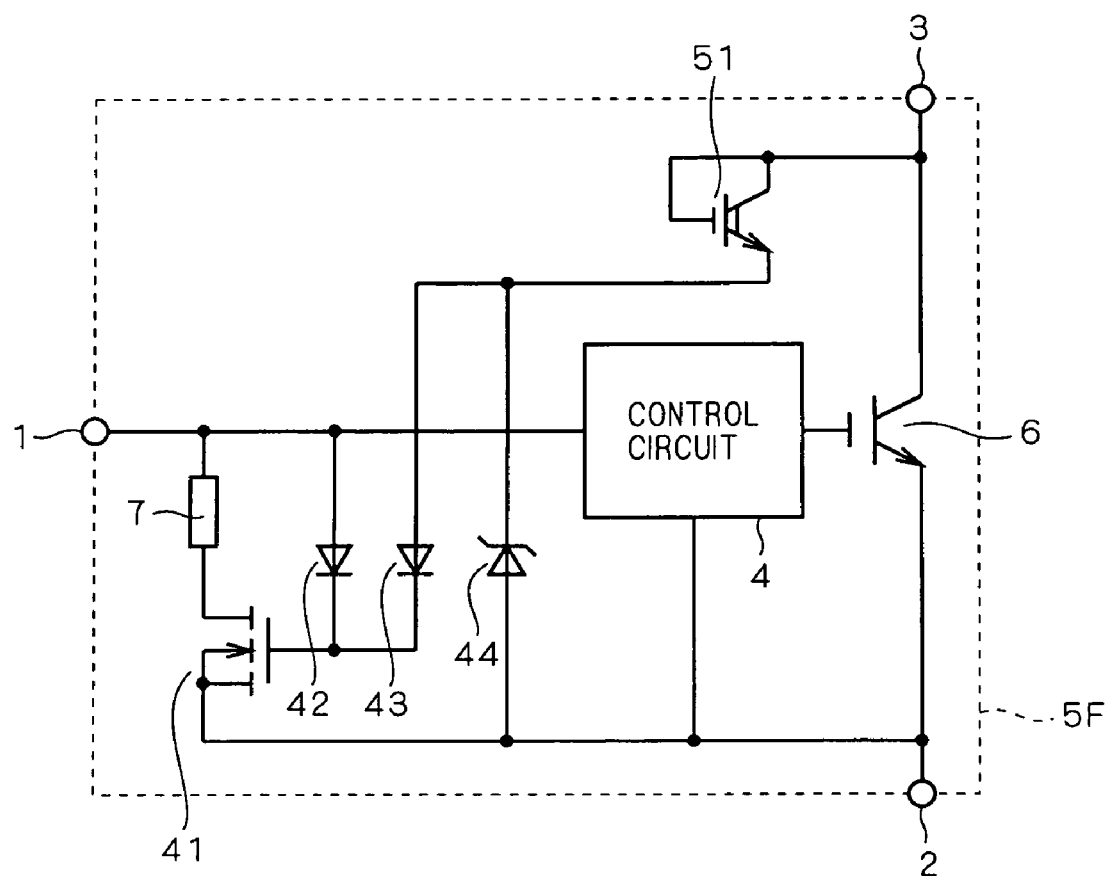
FIG. 12 is a circuit diagram illustrating a composition of a semiconductor device in which an IGBT is built according to a preferred embodiment 6 of the present invention.

FIG. 12 is a circuit diagram illustrating a composition of a semiconductor device 5F in which an IGBT is built according to the preferred embodiment 6 of the present invention. As shown in FIG. 12, a depletion type IGBT 51 (an output terminal resistance part) is provided instead of the resistance 45 of the preferred embodiment 4. That is to say, a collector and a gate of the depletion type IGBT 51 are connected to the output terminal 3, and its emitter is connected to the anode of the diode 43 and the cathode of the constant voltage diode 44. Besides, other composition is similar to that in the preferred embodiment 4 illustrated in FIG. 9.

In case of forming the IGBT 6 as the switching element, the depletion type IGBT 51 can be realized by setting an impurity concentration of a channel layer so that the current flow without a bias of the voltage to a gate of a MOSFET composition part which is a part of the IGBT. Accordingly, the depletion type IGBT 51 can be manufactured by manufacturing synchronously with the IGBT 6 and adding a process of setting the impurity concentration of the channel layer of the depletion type IGBT 51. Accordingly, the current can be taken out from the output terminal 3 with comparatively a small forming area without increasing the manufacturing cost.

In such a composition, in case that the load which is connected to the output terminal 3 when the input voltage given to the control input terminal 1 becomes the voltage that indicates the inactive state of the IGBT 6 is normal, a potential which enables the NMOS transistor 41 to be ready for ON state is given through the depletion type IGBT 51 in ON state and the diode 43, thus the NMOS transistor 41 turns to be ON state. In this case, the depletion type IGBT 51 provides a constant current, thus there is no risk of falling into a condition of an excess current provision.

In the meantime, in case that the defect such as the disconnection and so on occurs in the load, the potential of the output terminal 3 falls sharply below the source potential, and the gate potential of the NMOS transistor 41 given through the depletion type IGBT 51 and the diode 43 cannot make the NMOS transistor 41 be in ON state.

Accordingly, in case that the input voltage given to the control input terminal 1 becomes the voltage that indicates the inactive state of the IGBT 6, the semiconductor device 5F in the preferred embodiment 6 can detect that the load connected to the output terminal 3 is not normal, when the control input terminal 1 comes to be in the high-impedance state (by reason of the NMOS transistor 41 being in OFF state), in the same manner as that in the preferred embodiment 4 and preferred embodiment 5.

In this manner, the semiconductor device 5F in the preferred embodiment 6 has the effect similar to that in the preferred embodiment 4 by employing the depletion type IGBT 51 instead of the resistance 45, and moreover, it can also have an effect that the manufacturing cost decreases.

Moreover, in the same manner as the preferred embodiment 2, the schottky barrier diode to prevent the malfunction of the parasitic element can be provided between a drain and a source of the NMOS transistor 41, too.

<Preferred Embodiment 7>

Figure 13:
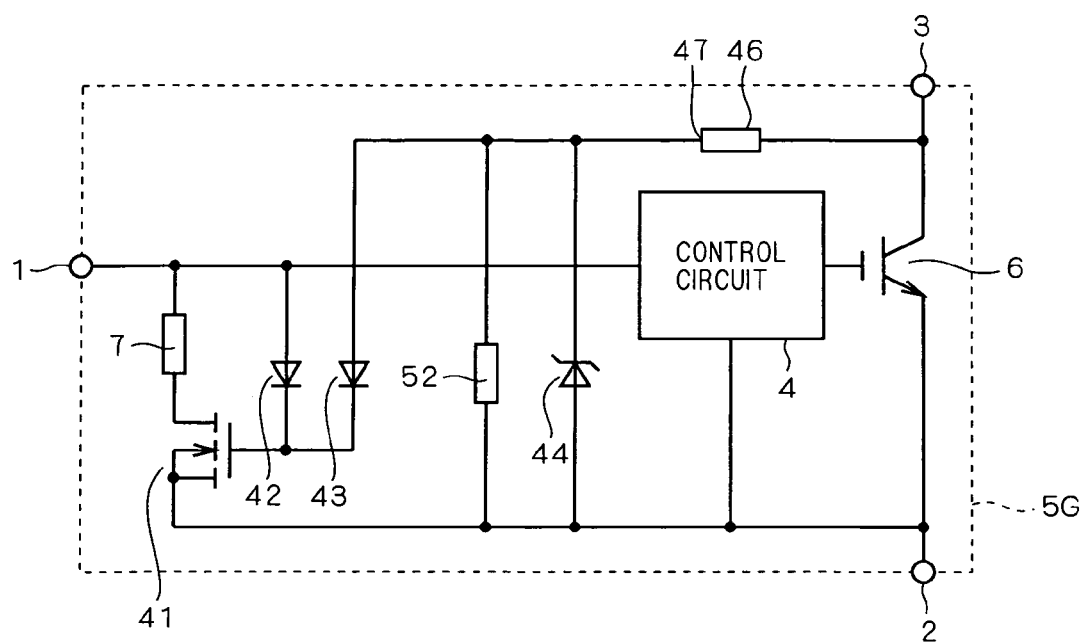
FIG. 13 is a circuit diagram illustrating a composition of a semiconductor device in which an IGBT is built according to a preferred embodiment 7 of the present invention.

FIG. 13 is a circuit diagram illustrating a composition of a semiconductor device 5G in which an IGBT is built according to the preferred embodiment 7 of the present invention. As shown in FIG. 13, a resistance 52 (a level adjusting resistance) is provided between the detection collector voltage output terminal 47 of the collector voltage detecting element 46 and the GND terminal 2. Besides, other composition is similar to that in the preferred embodiment 5 illustrated in FIG. 10.

The smaller a resistance value of the resistance 52 becomes, the larger the influence of the resistance value of the load connected to the output terminal 3 becomes, and a sufficient voltage cannot be provided for the gate of the NMOS transistor 41, thus it is necessary to adjust the resistance value of the resistance 52 appropriately. In particular, when the input voltage given to the control input terminal 1 becomes the voltage that indicates the inactive state of the IGBT 6, it is necessary to adjust the resistance value of the resistance 52 to make the NMOS transistor 41 turn to be ON/OFF according to a presence of the defect in the load connected to the output terminal 3.

The semiconductor device 5G can show the function as equal as the semiconductor device in the preferred embodiment 5 by adjusting the resistance value of the resistance 52 as described above.

Furthermore, the semiconductor device 5G in the preferred embodiment 7 can adjust previously a resistance value of the load to be detected as in a disconnection state according to the resistance value of the resistance 52.

For example, assuming that the pull-up voltage (the source voltage) of the load is VB, the resistance value of the load is Ro, the resistance of the collector voltage detecting element 46 is R46, the resistance of the resistance 52 is R52 and the forward voltage of the diode 43 is VF43, a voltage V41 impressed into the gate of the NMOS transistor 41 is expressed as {V41=R52·VB/(Ro+R46+R52)−VF43}, and when the voltage V41 falls below the threshold voltage of the NMOS transistor 41, the NMOS transistor 41 cannot turn to be ON, and the input impedance of the control input terminal 1 becomes high. Accordingly, the value of the load resistance Ro that the input impedance becomes high by adjusting the resistance value R52 can be adjusted.

Moreover, in the same manner as the preferred embodiment 2, the schottky barrier diode to prevent the malfunction of the parasitic element can be provided between a drain and a source of the NMOS transistor 41, too.

<Preferred Embodiment 8>

Figure 14:
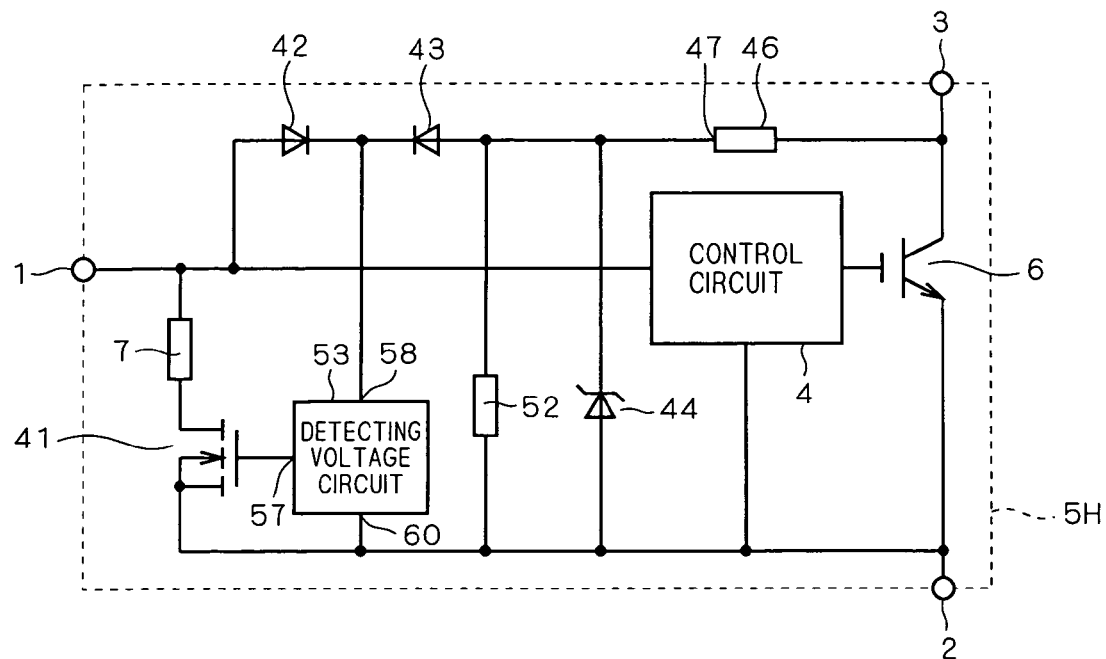
FIG. 14 is a circuit diagram illustrating a composition of a semiconductor device in which an IGBT is built according to a preferred embodiment 8 of the present invention.

FIG. 14 is a circuit diagram illustrating a composition of a semiconductor device 5H in which an IGBT is built according to the preferred embodiment 8 of the present invention. As shown in FIG. 14, a voltage detecting circuit 53 is provided on the gate of the NMOS transistor 41 and between a cathode of the diode 42 and a cathode of the diode

43. The voltage detecting circuit 53 is also connected to the GND terminal 2 for setting a reference potential. Other composition is similar to that in the preferred embodiment 7 illustrated in FIG. 13.

Figure 15:
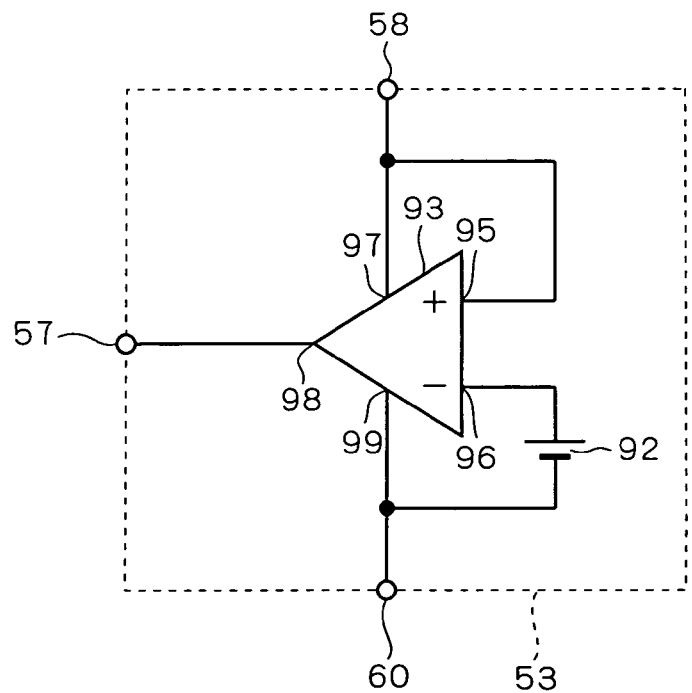
FIG. 15 is a circuit diagram illustrating an internal composition of a voltage detecting circuit in FIG. 14.

FIG. 15 is a circuit diagram illustrating an internal composition of the voltage detecting circuit 53. As shown in FIG. 15, the voltage detecting circuit 53 is composed of a reference voltage source 92 and a comparator 93, a non-inverted input part 95 and a source connecting part 97 of the comparator 93 are connected to a source terminal 58, a positive terminal of the reference voltage source 92 is connected to an inverted output part 96, a ground terminal 60 is connected to a ground connecting part 99 and an output terminal 57 is connected to an output part 98. Moreover, a negative terminal of the reference voltage source 92 is connected to the ground terminal 60.

In such a composition, the voltage detecting circuit 53 takes in an input-related voltage that the input voltage given to the control input terminal 1 is obtained through the diode 42 or an output-related voltage that the collector voltage obtained by the detection collector voltage output terminal 47 is obtained through the diode 43 from the source terminal 58 as a detecting voltage, and when the detecting voltage obtained by the source terminal 58 exceeds a reference voltage V92 of the reference voltage source 92, the comparator 93 turns to be "H" and is given to the gate electrode of the NMOS transistor 41 from the output terminal 57, thus the NMOS transistor 41 is set to be in ON state.

In the meantime, the detecting voltage described above falls below the reference voltage V92, the comparator turns to be "L" and is given to the gate electrode of the NMOS transistor 41 from the output terminal 57, thus the NMOS transistor 41 is set to be in OFF state.

The reference voltage V92 is set to be in a level lower than the input-related voltage described above which is obtained when the input voltage described above indicates the active state of the IGBT 6 and the output-related voltage described above when the load is normal in case that the input voltage described above indicates the inactive state of the IGBT 6, and higher than the output-related voltage described above when the load is not normal in case that the input voltage indicates the inactive state of the IGBT 6.

In this manner, the semiconductor device 5H in the preferred embodiment 8 can make the control input terminal 1 be in the high-impedance state with high accuracy by providing the voltage detecting circuit 53 controlling the ON/OFF of the NMOS transistor 41 on a basis of a comparison result of a predetermined level voltage with the input-related voltage or the output-related voltage described above, when the load connected to the output terminal 3 is not normal.

Moreover, in the same manner as the preferred embodiment 2, the schottky barrier diode to prevent the malfunction of the parasitic element can be provided between a drain and a source of the NMOS transistor 41, too.

<Preferred Embodiment 9>

FIG. 16 is a circuit diagram illustrating a composition of a semiconductor device 5I in which an IGBT is built according to the preferred embodiment 9 of the present invention. As shown in FIG. 16, a current detecting IGBT 54, a resistance 55 and a voltage detecting circuit 56A are newly added as compared with the semiconductor device 5G in the preferred embodiment 7.

A collector of the current detecting IGBT 54 is connected to the output terminal 3, its gate receives the output of the control circuit 4 in the same manner as the gate of the IGBT 6 and its emitter is connected to the GND terminal 2 through the resistance 55. The current detecting IGBT 54 passes a detecting current at a predetermined rate corresponding to the current flowing in the IGBT 6. A conversion of the current·voltage is performed on this detecting current by the resistance 55. That is to say, the resistance 55 functions as a current·voltage converting part, and a voltage obtained by one terminal of the resistance 55 becomes a current detecting voltage which can recognize the current flowing in the IGBT 6.

The output terminal 57 of the voltage detecting circuit 56A is connected to the gate of the NMOS transistor 41, the source terminal 58 is connected to the cathode of the diode 43, a first input terminal 59 is connected to one terminal of the resistance 55, the ground terminal 60 is connected to the GND terminal 2 and a second input terminal 61 is connected to the control input terminal 1.

Figure 17:
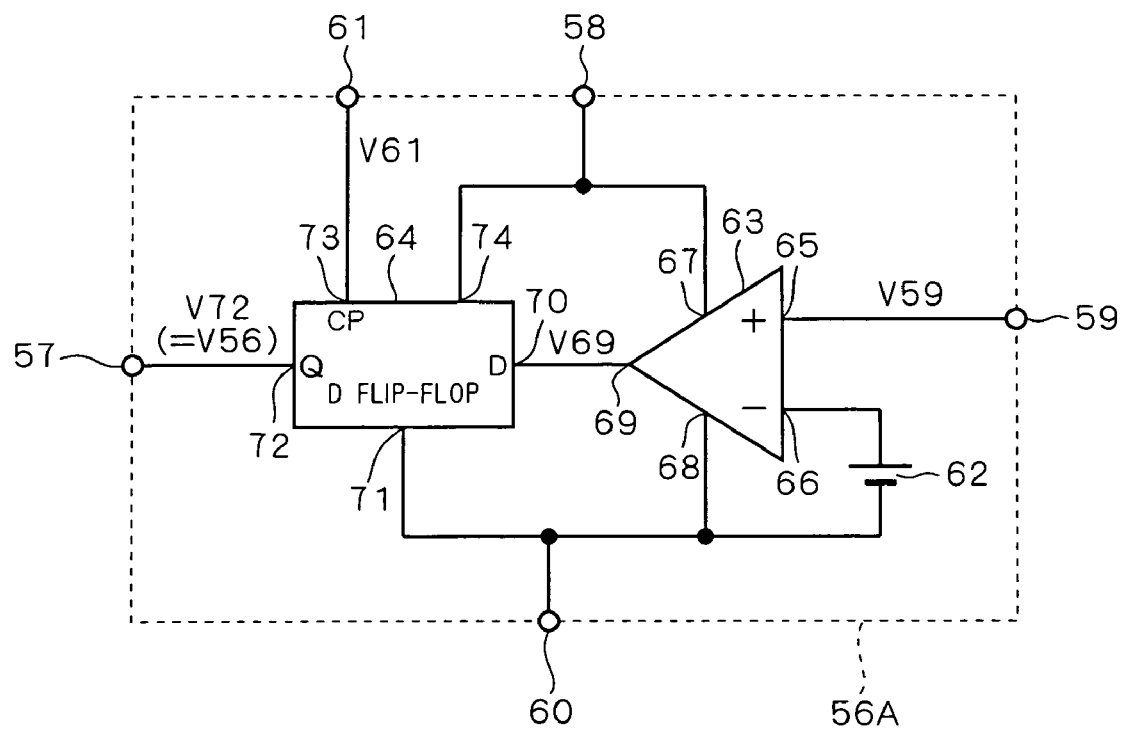
FIG. 17 is a circuit diagram illustrating an internal composition of a voltage detecting circuit in FIG. 16.

FIG. 17 is a circuit diagram illustrating an internal composition of the voltage detecting circuit 56A. The voltage detecting circuit 56A is composed of a reference voltage source 62, a comparator 63 and a D flip-flop 64.

In the comparator 63, a non-inverted input part 65 is connected to the first input terminal 59, an inverted input part 66 is connected to a positive terminal of the reference voltage source 62, a source connecting part 67 is connected to the source terminal 58, a ground connecting part 68 is connected to the ground terminal 60 and an output part 69 is connected with a D input part 70 of the D flip-flop 64. Besides, a negative terminal of the reference voltage source 62 is connected to the ground terminal 60.

The D flip-flop 64 receives an output of the comparator 63 from the D input part 70, a ground connecting part 71 is connected to the ground terminal 60, a Q output part 72 is connected to the output terminal 57, a CP input part 73 is connected to the second input terminal 61 and a source connecting part 74 is connected to the source terminal 58.

Figure 18:
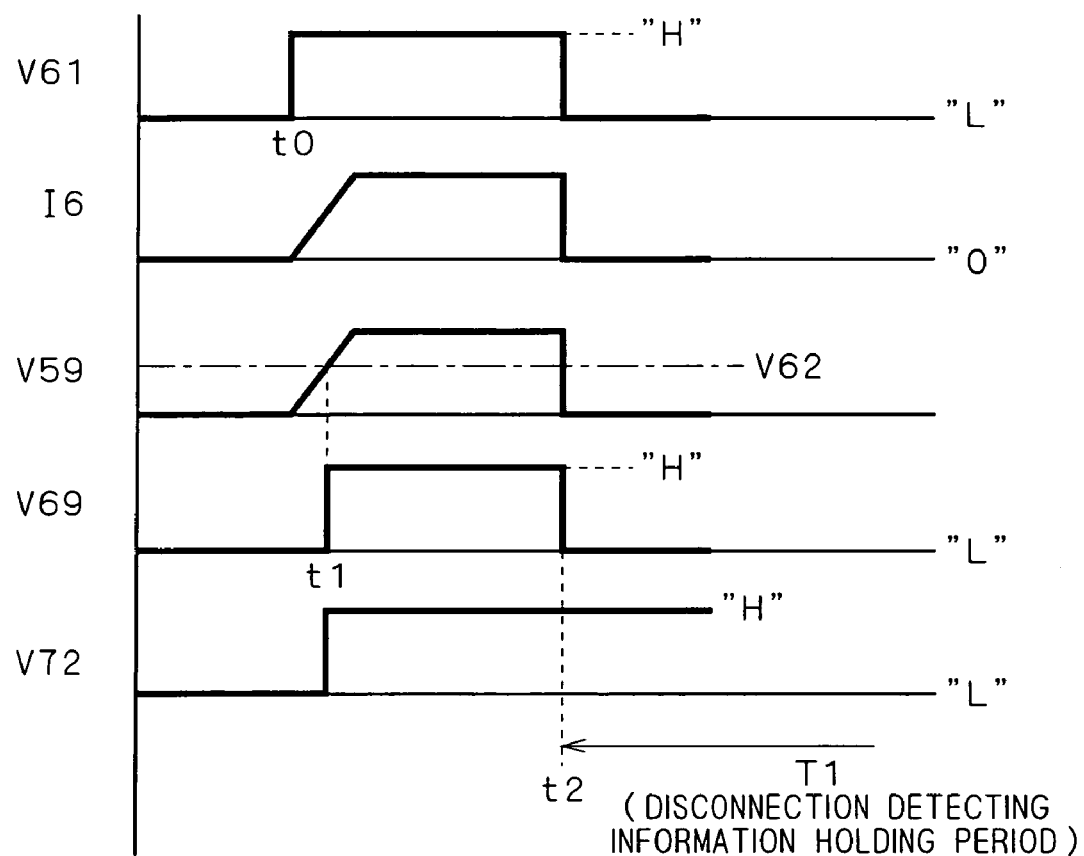
FIG. 18 is a timing chart illustrating a load disconnection detecting operation in case that a load by the semiconductor device according to the preferred embodiment 9 is normal.

FIG. 18 is a timing chart illustrating a load disconnection detecting operation in case that a load by the semiconductor device 5I is normal. As shown in FIG. 18, when an input voltage V6 given to the control input terminal 1 rises to "H" (indicating the active state of the IGBT 6) at a time t0, the control circuit 4 makes the IGBT 6 be in ON state, thus an IGBT current 16 flows from the IGBT 6. According to a rise of this IGBT current 16, a current detecting voltage V59 detected by the one terminal of the resistance 55 rises. At the same time, the CP input part 73 of the D flip-flop 64 becomes "H", thus the D flip-flop 64 outputs a comparator output voltage V69 obtained by the D input part 70 as a D flip-flop output voltage V72 without modification.

In case that the load connected to the output terminal 3 is normal, a reference voltage V62 (a predetermined reference voltage) by the reference voltage source 62 is set to fall below the current detecting voltage V59 in a static state sufficiently, thus the current detecting voltage V59 exceeds the reference voltage V62 at a time t1. As a result, the comparator output voltage V69 of the comparator 63 turns from "L" to "H" at the time t1.

Afterwards, the input voltage V61 falls to "L", the IGBT 6 turns to be in OFF state and the IGBT current 16 becomes "0" at a time t2. At the same time, the CP input part turns to "L", thus the comparator output voltage V69 in the time t2 is latched. Moreover, a latched signal in the "H" level is outputted as the D flip-flop output voltage V72 at or after the time t2.

Accordingly, the D flip-flop output voltage V72 in a disconnection detecting information holding period T1 at and after the time t2, that is to say, an output voltage V56 of a voltage detecting circuit 56 indicates "H", thus the NMOS transistor 41 maintains the ON state, and the control input terminal 1 does not turn to be in the high-impedance state.

In the meantime, when the load is not normal, the current flowing in the IGBT 6 is a little even in the active state, and the current detecting voltage V59 does not exceed the reference voltage V62, and then the D flip-flop 64 latches "L", thus the NMOS transistor 41 turns to be in OFF state, and the control input terminal 1 turns to be in the high-impedance state at or after the time t2.

In this manner, the semiconductor device 5I in the preferred embodiment 9 can perform the failure detection of the load in the same manner as the semiconductor devices in the preferred embodiment 4 to the preferred embodiment 8. Furthermore, it has the advantage of those in the preferred embodiment 4 to the preferred embodiment 8 in a point described below.

There is no problem when assuming a case that the resistance value of the load which can perform the detection of the disconnection has enormously a high range (a few k$\Omega$ to hundreds of k$\Omega$, for example) as compared with the operating current of the IGBT 6 in the preferred embodiment 4 to the preferred embodiment 8. However, in case of setting the resistance value of the load which can perform the detection of the disconnection to be small by lowering the resistance value by the resistance 52 and the collector voltage detecting element 46, the current flows even in case that the IGBT 6 is in OFF state at the same time, thus it is necessary to rise the resistance value described above without having an influence on a breaking characteristic of the current required for the IGBT 6.

In the meantime, in the preferred embodiment 9, a disconnection defect of the load can be detected when the IGBT 6 is in ON state, thus the disconnection defect can be detected without any problem even in case of setting the resistance value of the load which can perform the detection of the disconnection to be small.

Moreover, a level to detect an abnormal state of the load can be adjusted by adjusting the reference voltage V62 in the preferred embodiment 9.

Moreover, in the same manner as the preferred embodiment 2, the schottky barrier diode to prevent the malfunction of the parasitic element can be provided between a drain and a source of the NMOS transistor 41, too.

<Preferred Embodiment 10>

Inductive loads such as coils and so on are heavily employed as the load connected to the output terminal 3. In case of driving the inductive load, an hourly variation of the flowing current is small. That is to say, the inductive load has a feature that the larger a value of an inductive constituent (an inductive) is, the smaller the hourly variation of the current becomes. Accordingly, in case that the current flow more than the predetermined value in comparatively a short time right after the IGBT 6 turn to be ON, there is a strong possibility that the inductance of the inductive load becomes small or the load is short-circuited. The semiconductor device in the preferred embodiment 10 has a function of detecting a short-circuit of the load with employing a characteristic of the inductive load described above.

FIG. 19 is a circuit diagram illustrating an internal composition of a voltage detecting circuit 56B employed in the semiconductor device in the preferred embodiment 10 of the present invention. Besides, the whole composition of the semiconductor device in the preferred embodiment 10 is similar to the semiconductor device 51 illustrated in FIG. 16 except for a part that the voltage detecting circuit 56A is exchanged for the voltage detecting circuit 56B.

The voltage detecting circuit 56B is composed of the reference voltage source 62, the comparator 63, the D flip-flop 64, a resistance 75, a capacitor 76, a comparator 77, a reference voltage source 81, an inverter 82 and an AND gate 83.

In the comparator 63, the non-inverted input part 65 is connected to the first input terminal 59, the inverted input part 66 is connected to the positive terminal of the reference voltage source 62, the source connecting part 67 is connected to the source terminal 58, the ground connecting part 68 is connected to the ground terminal 60 and the output part 69 is connected to the D input part 70 of the D flip-flop 64. Besides, the negative terminal of the reference voltage source 62 is connected to the ground terminal 60.

The D flip-flop 64 receives the output of the comparator 63 from the D input part 70, the ground connecting part 71 is connected to the ground terminal 60, the Q output part 72 is connected to an input part of the inverter 82, the CP input part 73 is connected to an output of the AND gate 83 and the source connecting part 74 is connected to the source terminal 58.

The resistance 75 and the capacitor 76 is interposed in series between the second input terminal 61 and the ground terminal 60. That is to say, one terminal of the resistance 75 is connected to the second input terminal 61, its other terminal is connected to one electrode of the capacitor 76 and other electrode of the capacitor 76 is connected to the ground terminal 60.

In the comparator 77, an inverted input part 78 is connected to a node N1 between the other terminal of the resistance 75 and the one side of the electrode of the capacitor 76, a non-inverted input part 79 is connected to a positive terminal of the reference voltage source 81, a source connecting part 87 is connected to the source terminal 58 and a ground connecting part 88 is connected to the ground terminal 60. A negative terminal of the reference voltage source 81 is connected to the ground terminal 60.

In the inverter 82, the input part is connected to an output of the D flip-flop 64, and an output part is connected to the output terminal 57. In the AND gate 83, one input is connected to the second input terminal 61, and other input is connected to an output part 80 of the comparator 77.

Figure 20:
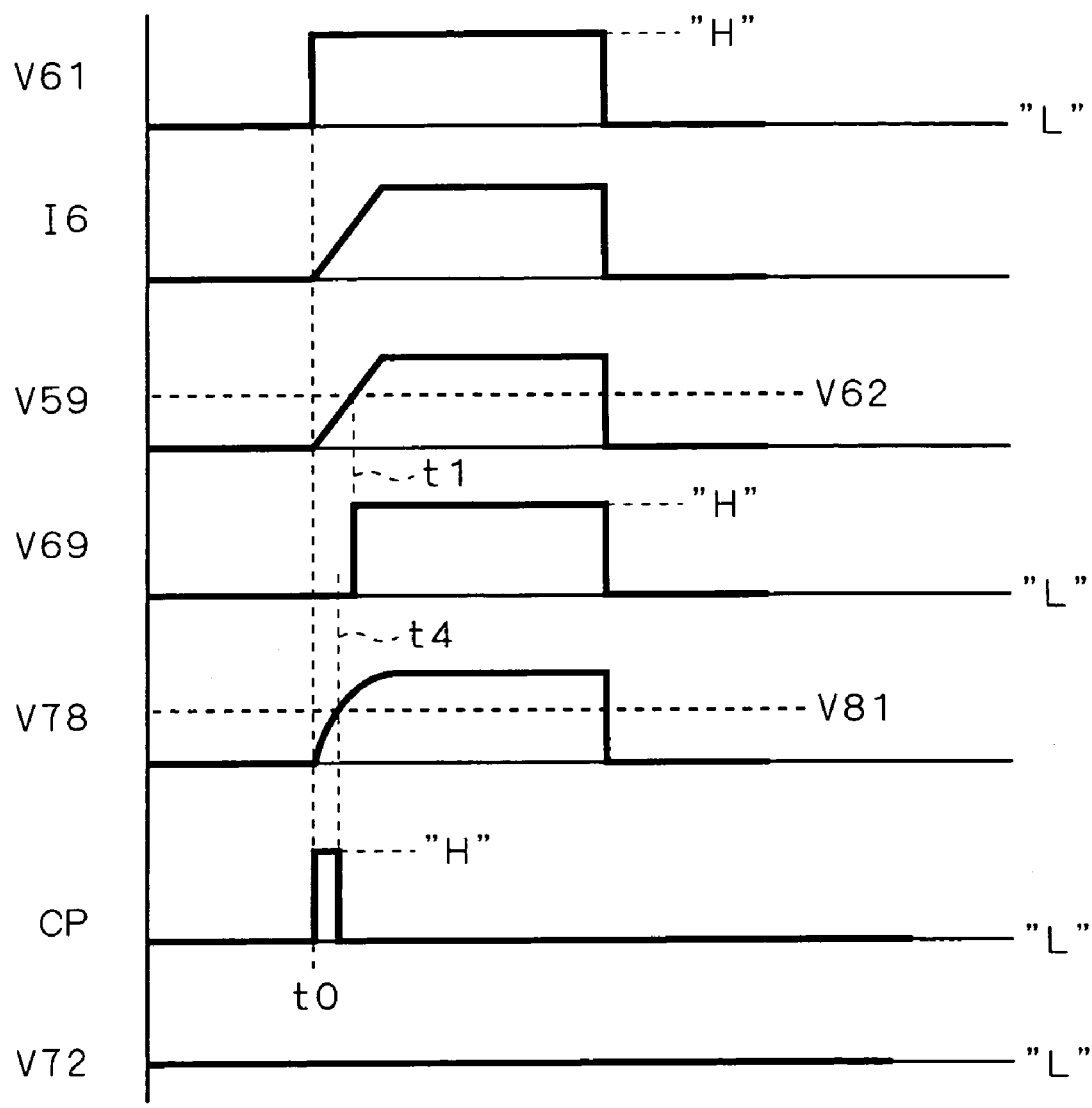
FIG. 20 is a timing chart illustrating a load short-circuit detecting operation (the load is normal) according to the semiconductor device in preferred embodiment 10.

FIG. 20 is a timing chart illustrating a load short-circuit detecting operation in case that the load is normal according to the semiconductor device in the preferred embodiment 10. As shown in FIG. 20, when the input voltage V61 given to the control input terminal 1 rises to "H" at the time t0, the control circuit 4 makes the IGBT 6 be in ON state, thus the IGBT current 16 flows by the IGBT 6. According to the rise of this IGBT current 16, the current detecting voltage V59 rises.

In case that the load connected to the output terminal 3 is normal, the reference voltage V62 (the predetermined reference voltage) by the reference voltage source 62 is set to fall below the current detecting voltage V59 in the static state sufficiently, thus the current detecting voltage V59 exceeds the reference voltage V62 at the time t1. As a result, the comparator output voltage V69 of the comparator 63 turn from "L" to "H" at the time t1.

In the meantime, a capacitor voltage V78 of the node N1 rises from the time t0 according to a RC constant determined by a resistance value of the resistance 75 and a capacity value of the capacitor 76. Moreover, when the capacitor voltage V78 exceeds a reference voltage V81 by the reference voltage source 81 at a time t4, an output of the comparator 77 becomes "L", and a relative potential CP which is the output of the AND gate 83 falls to "L".

At this time, with regard to the reference voltage V81, a period of the time t0 to t4 (a short-circuit detecting period) is set to be shorter than a period of the time t0 to t1 (a detecting current detecting period) in case that the load is normal.

Accordingly, at the time t4 that the relative potential CP obtained by the CP input part 73 of the D flip-flop 64 changes from "H" to "L", the comparator output voltage V69 still maintains "L", thus the D flip-flop 64 latches "L" which is the comparator output voltage V69 at the time t4. Moreover, a latched "L" level signal is outputted as the D flip-flop output voltage V72 at or after the time t4.

Accordingly, the D flip-flop output voltage V72 maintains "L" in the whole period, thus the output voltage V56 obtained through the inverter 82 maintains "H" in the whole period.

Figure 21:
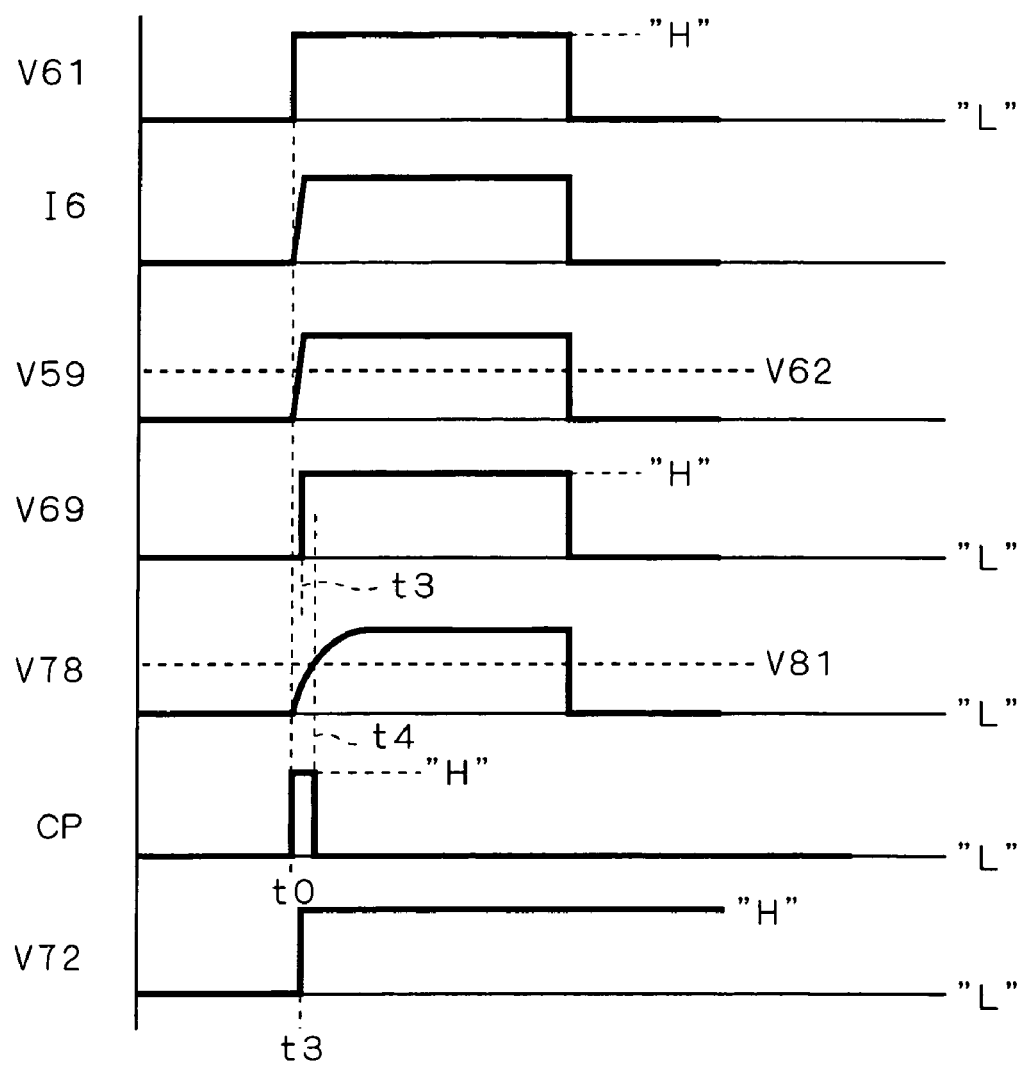
FIG. 21 is a timing chart illustrating a load short-circuit detecting operation (the load is abnormal) according to the semiconductor device in preferred embodiment 10.

FIG. 21 is a timing chart illustrating a load short-circuit detecting operation in case that the load is short-circuited according to the semiconductor device in the preferred embodiment 10. As shown in FIG. 21, when the input voltage V61 given to the control input terminal 1 rises to "H" at the time to, an IGBT current 16 starts to flow rapidly by reason of the short-circuit of the load. According to the rise of this IGBT current 16, the current detecting voltage V59 also rises rapidly.

As a result, the comparator output voltage V69 of the comparator 63 (the D flip-flop output voltage V72) turns from "L" to "H" at the time t3. At this time, with regard to the reference voltage V81, the period of a time t0 to t3 (the detecting current detecting period) is set to be shorter than the period of the time t0 to t4 (the short-circuit detecting period) in case that the load is short-circuited. Accordingly, the relative potential CP maintains "H" at the time t3.

Afterwards, when the relative potential CP turns from "H" to "L" at the time t4, the comparator output voltage V69 turns to "H", thus the D flip-flop 64 latches "H" which is the comparator output voltage V69 at the time t4. Moreover, a latched "H" level signal is outputted as the D flip-flop output voltage V72 at or after the time t4.

Accordingly, the D flip-flop output voltage V72 maintains "H" at or after the time t3, thus the output voltage V56 obtained through the inverter 82 becomes "L" at or after the time t3 and makes the NMOS transistor 41 be in OFF state.

As a result, the control input terminal 1 comes to be in the high-impedance state at or after the time t4, and a short-circuit defect of the load is detected.

In this manner, the semiconductor device in the preferred embodiment 10 can rise the impedance accuracy in the same manner as the semiconductor devices in the preferred embodiment 1 to the preferred embodiment 3 and also detect a short-circuit defect of the load.

<Preferred Embodiment 11>

Figure 22:
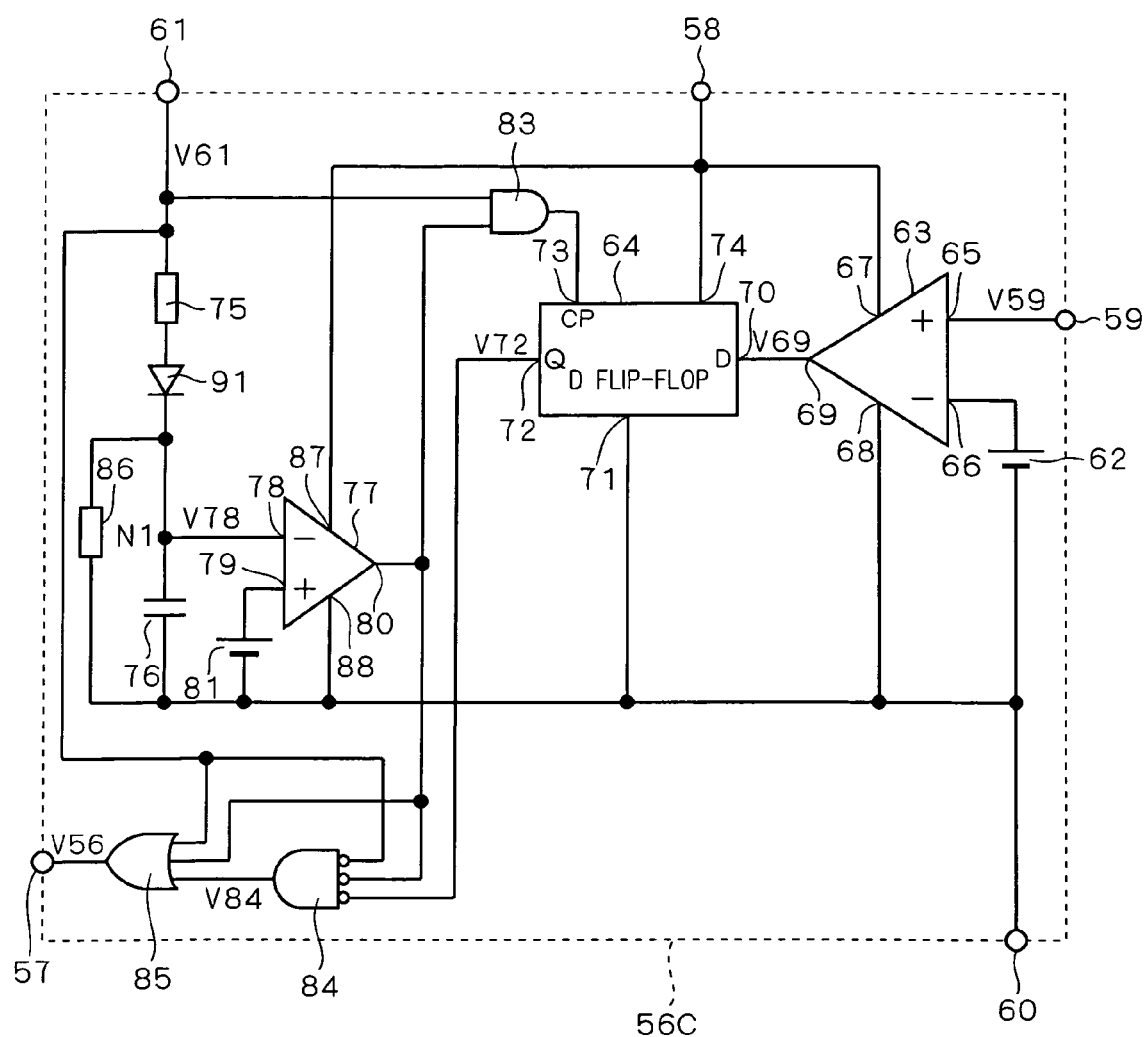
FIG. 22 is a circuit diagram illustrating an internal composition of a voltage detecting circuit employed in a semiconductor device according to a preferred embodiment 11 of the present invention.

FIG. 22 is a circuit diagram illustrating an internal composition of a voltage detecting circuit 56C employed in a semiconductor device in the preferred embodiment 11 of the present invention. Besides, the whole composition of the semiconductor device in the preferred embodiment 11 is similar to the semiconductor device 51 illustrated in FIG. 16 except for a part that the voltage detecting circuit 56A is exchanged for the voltage detecting circuit 56C.

The voltage detecting circuit 56C is composed of the reference voltage source 62, the comparator 63, the D flip-flop 64, resistances 75 and 86, the capacitor 76, the comparator 77, the reference voltage source 81, AND gates 83 and 84, an OR gate 85 and a diode 91.

In the comparator 63, the non-inverted input part 65 is connected to the first input terminal 59, the inverted input part 66 is connected to the positive terminal of the reference voltage source 62, the source connecting part 67 is connected to the source terminal 58, the ground connecting part 68 is connected to the ground terminal 60 and the output part 69 is connected to the D input part 70 of the D flip-flop 64. Besides, the negative terminal of the reference voltage source 62 is connected to the ground terminal 60.

The D flip-flop 64 receives the output of the comparator 63 from the D input part 70, the ground connecting part 71 is connected to the ground terminal 60, the Q output part 72 is connected to an input part of the inverter 82, the CP input part 73 is connected to the output of the AND gate 83 and the source connecting part 74 is connected to the source terminal 58.

The resistance 75, the diode 91 and the capacitor 76 are interposed in series between the second input terminal 61 and the ground terminal 60. That is to say, the one terminal of the resistance 75 is connected to the second input terminal 61, its other terminal is connected to an anode of the diode 91, a cathode of the diode 91 is connected to one electrode of the capacitor 76 and the other electrode of the capacitor 76 is connected to the ground terminal 60. Furthermore, the resistance 86 is connected in parallel to the capacitor 76. That is to say, one terminal of the resistance 86 is connected to the one electrode of the capacitor 76, and its other terminal is connected to the ground terminal 60 (the other electrode of the capacitor 76).

In the comparator 77, the inverted input part 78 is connected to the node N1 between a cathode of the diode 91 and the one electrode of the capacitor 76, the non-inverted input part 79 is connected to the positive terminal of the reference voltage source 81, the source connecting part 87 is connected to the source terminal 58 and the ground connecting part 88 is connected to the ground terminal 60. The negative terminal of the reference voltage source 81 is connected to the ground terminal 60.

In the AND gate 83, one input is connected to the second input terminal 61, and other input receives an output voltage V80 by the output part 80 of the comparator 77.

In the AND gate 84 having three inputs, a first input receives an inverted signal of the input voltage V61, a second input receives an inverted signal of the output voltage V80, a third input receives an inverted signal of the D flip-flop output voltage V72 and an AND of the first to third inputs is outputted as an output voltage V84.

In the OR gate 85 having three inputs, a first input receives the input voltage V61, a second input receives the output voltage V80, a third input receives the output voltage V84 and an OR of the first to third inputs is outputted as the output voltage V56 from an output terminal 57.

Besides, in the same manner as the comparator 63 and the comparator 77, a source is supplied by the source terminal 58 and a ground setting is performed by the ground terminal 60 in the AND gate 83, the AND gate 84 and the OR gate 85, as they are not shown in FIG. 22. Moreover, at least the OR gate 85 is set to output "L" compulsorily in case that the source is not supplied sufficiently by a side of the source terminal 58.

Figure 23:
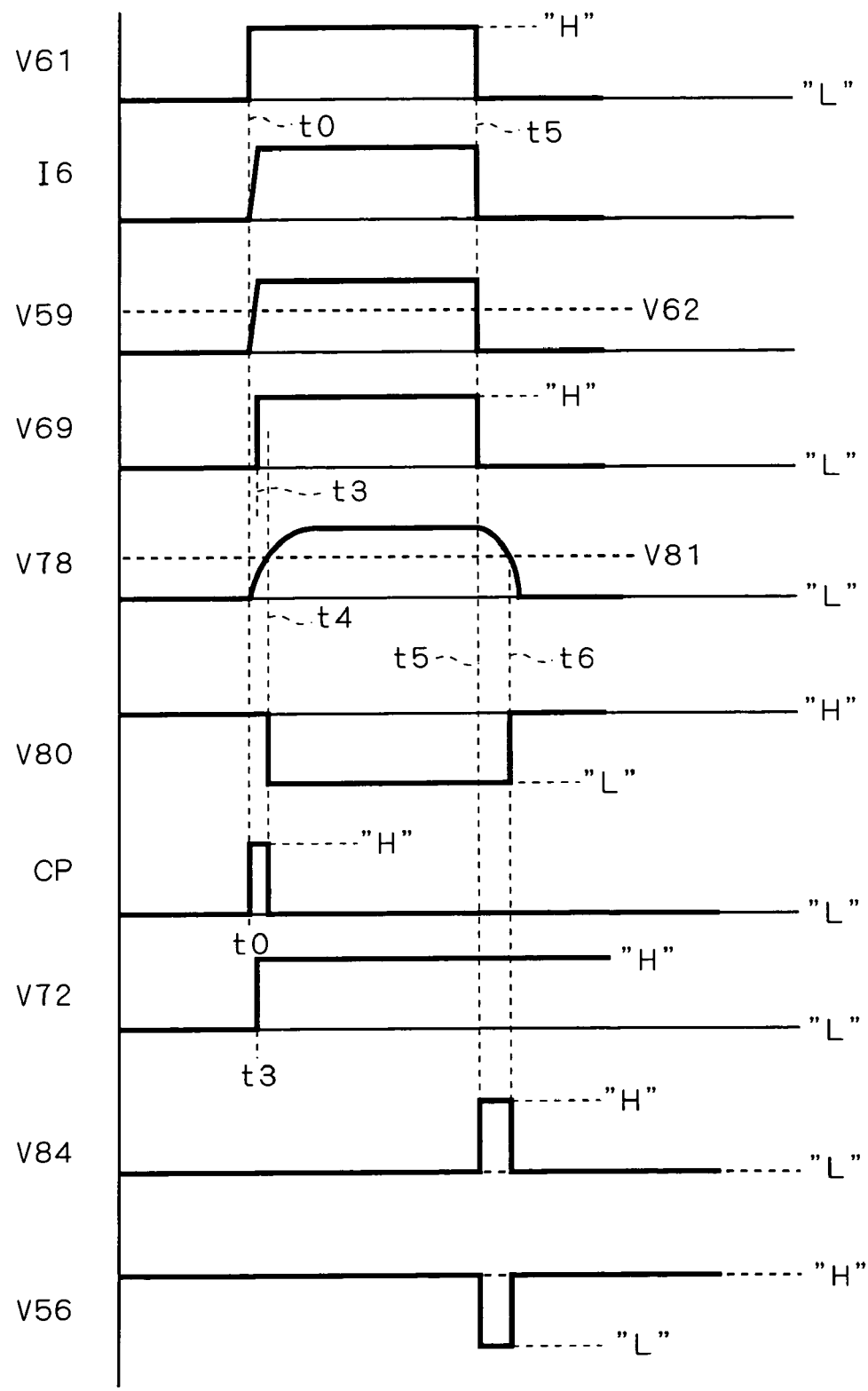
FIG. 23 is a timing chart illustrating a load short-circuit detecting operation according to the semiconductor device in the preferred embodiment 11.

FIG. 23 is a timing chart illustrating a load short-circuit detecting operation in case that the load is short-circuited according to the semiconductor device in the preferred embodiment 11.

As shown in FIG. 23, the input voltage V61 becomes "L" and the output voltage V80 becomes "H" at or before the time t0, thus the output voltage V56 becomes "H".

When the input voltage V61 given to the control input terminal 1 rises to "H" at the time to, the IGBT current 16 starts to flow rapidly by reason of the short-circuit of the load. According to the rise of this IGBT current 16, the current detecting voltage V59 also rises rapidly. As a result, the comparator output voltage V69 of the comparator 63 (the D flip-flop output voltage V72) turns from "L" to "H" at the time t3.

In the meantime, the capacitor voltage V78 of the node N1 rises from the time t0 according to the RC constant determined by the resistance value of the resistance 75 and the capacity value of the capacitor 76. Moreover, when the capacitor voltage V78 exceeds the reference voltage V81 by the reference voltage source 81 at the time t4, the output of the comparator 77 becomes "L", and the relative potential CP which is the output of the AND gate 83 falls to "L".

At this time, with regard to the reference voltage V81, the period of the time t0 to t3 (the detecting current detecting period) is set to be shorter than the period of the time t0 to t4 (the short-circuit detecting period) in case that the load is short-circuited. Accordingly, the relative potential CP maintains "H" at the time t3.

Accordingly, as described above, when the relative potential CP turns from "H" to "L" at the time t4, the comparator output voltage V69 turns to "H", thus the D flip-flop 64 latches "H" which is the comparator output voltage V69 at the time t4. Moreover, the latched "H" level signal is outputted as the D flip-flop output voltage V72 at or after the time t4.

Afterwards, when the input voltage V61 falls to "L" at a time t5, the capacitor voltage V78 decreases at the RC constant defined by a resistance value of the resistance 86 and a capacitance value of the capacitor 76. Besides, during the period of the time t0 to t5, the input voltage V61 becomes "H", thus the output voltage V56 maintains "H".

Moreover, when the capacitor voltage V78 falls below the reference voltage V81 at a time t6, the output voltage V80 rises from "L" to "H". Besides, the diode 91 is provided to prevent an accumulation charge of the capacitor 76 from being discharged through the second input terminal 61, and the resistance 86 is provided to delay a time of discharge of the capacitor voltage V78 when the input voltage V61 becomes "L".

Accordingly, during the period of the time t5 to t6, the input voltage V61 becomes "L", the output voltage V80 becomes "L", the D flip-flop output voltage V72 becomes "H" and the output voltage V84 of the AND gate 84 becomes "L", thus the output voltage V56 becomes "L".

In the meantime, in case that the load is not short-circuited, the output voltage V56 maintains "H" (illustrated with a broke line in FIG. 23) during the period of the time t5 to t6, too, since the D flip-flop output voltage V72 is always in "L" state as illustrated in the timing chart in the preferred embodiment 10 shown in FIG. 20.

The output voltage V80 maintains "H", thus the output voltage V56 becomes "H" regardless of the short-circuit of the load at or after the time t6.

In this manner, in case that the load is short-circuited, the output voltage V56 becomes "L" during the time t5 to t6, only, and the semiconductor device in the preferred embodiment 11 makes the NMOS transistor 41 be in OFF state.

As a result, the short-circuit defect of the load can be recognized by detecting whether the control input terminal 1 is in the high-impedance state during the time t5 to t6.

In the meantime, in case that the load is short-circuited, the source cannot be supplied sufficiently from the source terminal 58 connected electrically to the output terminal 3. Accordingly, the output voltage V56 which is the output of the OR gate 85 is set to "L" compulsorily.

As a result, the NMOS transistor 41 turns to be in OFF state, the control input terminal 1 turns to be in the high-impedance state and it becomes possible to detect a disconnection defect of the load.

In this manner, the semiconductor device in the preferred embodiment 11 determines a case that the output-related voltage obtained by the source terminal 58 does not satisfy a predetermined standard (a case that it is not sufficient as a driving source of the OR gate 85) as the disconnection defect of the load, and makes the control input terminal 1 be in the high-impedance state during a period except for the period of the time t5 to t6, too.

The semiconductor device in the preferred embodiment 11 described above can recognize two abnormal states and a normal state as described in (1) to (3) hereinafter.

(1) When the control input terminal 1 is in the high-impedance state during the period except for the period of the time t5 to t6, it recognizes the disconnection defect of the load.

(2) When the control input terminal 1 is in the high-impedance state during the period of the time t5 to t6 when not satifying (1) described above, it recognizes the short-circuit defect of the load.

(3) When the control input terminal 1 is not in the high-impedance state during the whole period, it recognizes that the load is normal.

In this manner, the semiconductor device in the preferred embodiment 11 has an effect that it can recognize the abnormal state as the disconnection defect ((1) described above) or the short-circuit defect ((2) described above) from a side of driving the semiconductor device only by measuring the input impedance of the control input terminal 1 with changing a timing of a measure from outside, in addition to the effect described in the preferred embodiment 10.

Moreover, the semiconductor device in the preferred embodiment 11 can detect all of the disconnections in a side of the control input terminal 1, a side of the GND terminal 2 (these two can conventionally be detected) and a side of the output terminal 3 in the semiconductor device while examining the short-circuit defect and can be employed safely while monitoring constantly a condition of the connection of the semiconductor device.

<Other>

Besides, the IGBT is described as the power switching element in the preferred embodiments described above, however, a similar effect can be obtained by employing other power switching elements such as a power MOSFET and so on. Moreover, the control circuit 4 can be realized with various circuit composition such as a circuit realized with employing NMOS transistors and PMOS transistors, a circuit realized with a CMOS structure and so on.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   an input terminal, a reference terminal and an output terminal;
   a switching element formed on a semiconductor substrate, whose one electrode is connected to said output terminal and whose other electrode is connected to said reference terminal;
   a control circuit providing a control signal for a control electrode of said switching element based on an input voltage obtained by said input terminal to control a conduction/non-conduction of said switching element; and a resistance part formed on said semiconductor substrate and interposed between said input terminal and said reference terminal, an input impedance of said input terminal being defined by said resistance part, wherein said resistance part includes a first resistance having a first temperature dependence; and a second resistance connected in parallel with or in series to said first resistance and having a second temperature dependence, said input impedance being defined by a combined resistance by said first and said second resistances and said first and said second temperature dependences are in an opposite relation to each other in a change of a resistance value according to a temperature change.

2. The semiconductor device according to claim 1, wherein said first resistance includes a polysilicon resistance formed on said semiconductor substrate, said second resistance includes a diffusion resistance by a second semiconductor region of a second conductivity type provided in a first semiconductor region of a first conductivity type formed on said semiconductor substrate, and said resistance part further includes a schottky barrier diode interposed between said first and said semiconductor regions, an anode and a cathode of said schottky barrier diode being electrically connected to a P type and a N type regions out of said first and said second semiconductor regions, respectively.

3. The semiconductor device according to claim 2, wherein said first conductivity type includes a N type, said second conductivity type includes a P type, and in said schottky barrier diode, the anode is connected electrically to said second semiconductor region, and the cathode is connected electrically to said first semiconductor region.

4. The semiconductor device according to claim 2, wherein said first conductivity type includes a P type, said second conductivity type includes a N type, and in said schottky barrier diode, the anode is connected electrically to said first semiconductor region, and the cathode is connected electrically to said second semiconductor region.

5. The semiconductor device according to claim 1, wherein said first resistance includes a polysilicon resistance formed on said semiconductor substrate, said second resistance includes an insulating gate type transistor of a predetermined conductivity type formed on said semiconductor substrate and having a gate electrode connected to said input terminal.

6. The semiconductor device according to claim 5, wherein said resistance part further includes a schottky barrier diode connected to at least one electrode region so as to function as other current route in case that a formed bias is applied to said at least one electrode region of said insulating gate type transistor.

7. The semiconductor device according to claim 5, wherein a gate electrode of said insulating gate type transistor is connected directly to said input terminal.

8. The semiconductor device according to claim 5, wherein said resistance part includes a plurality of combined resistance parts, and each of said plurality of combined resistance parts includes said polysilicon resistance;

said insulating gate type transistor;

a third resistance; and a zener diode, said third resistance and said zener diode connected in series between said input terminal and said reference terminal, wherein a gate electrode of said insulating gate type transistor is connected to a node between said third resistance and said zener diode.

9. The semiconductor device according to claim 5, wherein one electrode of said insulating gate type transistor is connected to other terminal of said first resistance, and other electrode of said insulating gate type transistor is connected to said reference terminal, said semiconductor device further comprising:

an output-related voltage giving part interposed between said output terminal and a gate electrode of said insulating gate type transistor and giving an output-related voltage related to an output voltage obtained by said output terminal to a gate electrode of said insulating gate type transistor.

10. The semiconductor device according to claim 9, wherein said predetermined conductivity type includes a N type, and said output-related voltage giving part includes an output terminal resistance part whose one terminal is connected to said output terminal;

an input terminal diode whose anode is connected to said input terminal and whose cathode is connected to a gate electrode of said insulating gate type transistor;

an output terminal diode whose anode is connected to other terminal of said output terminal resistance part and whose cathode is connected to a gate electrode of said insulating gate type transistor; and a constant voltage diode whose anode is connected to said reference terminal and whose cathode is connected to other terminal of said output terminal resistance part.

11. The semiconductor device according to claim 10, wherein said output terminal resistance part includes a semiconductor element whose resistance value changes by a JFET effect based on a voltage obtained by said output terminal.

12. The semiconductor device according to claim 10, wherein said output terminal resistance part includes a depression type switching element whose one electrode and control electrode are connected to said output terminal and whose other electrode is connected to an anode of said output terminal diode.

13. The semiconductor device according to claim 10, wherein said output-related voltage giving part further includes a level adjusting resistance interposed between other terminal of said output terminal resistance part and said reference terminal.

14. The semiconductor device according to claim 9, wherein said output-related voltage giving part includes a voltage detecting circuit receiving an input-related voltage related to said input voltage and an output-related voltage related to said output voltage and making said insulating gate type transistor be off in case that one of said input-related voltage and said output-related voltage is equal to or lower than a predetermined voltage.

15. The semiconductor device according to claim 5, wherein one electrode of said insulating gate type transistor is connected to other terminal of said first resistance and other electrode of said insulating gate type transistor is connected to said reference terminal, and said semiconductor device further comprising:

a current detecting switching element whose one electrode is connected to said output terminal and whose control electrode receives said control signal;

a current-voltage converting part obtaining a current detecting voltage by performing a current-voltage conversion of a detecting current flowing in said current detecting switched element; and a voltage detecting circuit receiving said current detecting voltage and making said insulating gate type transistor be off in case that said current detecting voltage is equal to or lower than a predetermined reference voltage.

16. The semiconductor device according to claim 5, wherein one electrode of said insulating gate type transistor is connected with other terminal of said first resistance and other electrode of said insulating gate type transistor is connected to said reference terminal, and said semiconductor device further comprising:

a current detecting switching element whose one electrode is connected to said output terminal and whose control electrode receives said control signal;

a current-voltage converting part obtaining a current detecting voltage by performing a current-voltage conversion of a detecting current flowing in said current detecting switched element; and a voltage detecting circuit receiving said current detecting voltage and making said insulating gate type transistor be off during at least part of a period in case that said current detecting voltage is equal to or higher than a predetermined reference voltage in a short-circuit detecting period right after said input voltage changes into a voltage indicating an active state of said switching element.

17. The semiconductor device according to claim 16, wherein said voltage detecting circuit further receives an output-related voltage related to said output voltage, said at least part of said period includes a predetermine period after said short-circuit detecting period, and in case that said output-related voltage does not satisfy a predetermined standard, said insulating gate type transistor is made to be off in a period except for said predetermined period.

* * * * *